US008565011B2

(12) United States Patent
Fukami et al.

(10) Patent No.: US 8,565,011 B2
(45) Date of Patent: Oct. 22, 2013

(54) METHOD OF INITIALIZING MAGNETIC MEMORY ELEMENT

(75) Inventors: Shunsuke Fukami, Tokyo (JP);
Kiyokazu Nagahara, Tokyo (JP);
Tetsuhiro Suzuki, Tokyo (JP);
Nobuyuki Ishiwata, Tokyo (JP);
Norikazu Ohshima, Tokyo (JP)

(73) Assignee: NEC Corporation, Tokyo (JP)

(\*) Notice: Subject to any disclaimer, the term of this patent is extended or adjusted under 35 U.S.C. 154(b) by 20 days.

(21) Appl. No.: 13/120,626

(22) PCT Filed: Oct. 29, 2009

(86) PCT No.: PCT/JP2009/068573
§ 371 (c)(1),
(2), (4) Date: Apr. 26, 2011

(87) PCT Pub. No.: WO2010/053039
PCT Pub. Date: May 14, 2010

(65) Prior Publication Data
US 2011/0199818 A1 Aug. 18, 2011

(30) Foreign Application Priority Data
Nov. 7, 2008 (JP) .................................. 2008-287164

(51) Int. Cl.
*G11C 11/00* (2006.01)
(52) U.S. Cl.
USPC ........................................................ 365/158
(58) Field of Classification Search
USPC ........................................................ 365/158
See application file for complete search history.

(56) References Cited

U.S. PATENT DOCUMENTS 8,159,865 B2 \* 4/2012 Ohmori .......................... 365/158
2007/0177291 A1 \* 8/2007 Wakamatsu et al. ............ 360/17

FOREIGN PATENT DOCUMENTS

| JP | 2005191032 A | 7/2005 |
| JP | 2006073930 A | 3/2006 |
| WO | 2007119748 A | 10/2007 |
| WO | 2008047536 A | 4/2008 |

OTHER PUBLICATIONS

International Search Report for PCT/JP2009/068573 mailed Feb. 9, 2010.
N. Sakimura et al., "MRAM Cell Technology for Over 500-MHz SoC", IEEE Journal of Solid-State Circuits, vol. 42, No. 4, Apr. 2007, pp. 830-838.
A. Yamaguchi et al., "Real-Space Observation of Current-Driven Domain Wall Motion in Submicron Magnetic Wires", Physical Review Letters, vol. 92, No. 7, Feb. 20, 2004, pp. 077205-1~4.
S. Fukami et al., "Micromagnetic analysis of current driven domain wall motion in nanostrips with perpendicular magnetic anisotropy", Journal of Applied Physics, vol. 103, 2008, pp. 07E718-1~3.
H. Tanigawa et al., "Current-Driven Domain Wall Motion in CoCrPt Wires with Perpendicular Magnetic Anisotropy", Applied Physics Express, vol. 1, 2008. pp. 011301-1~3.

\* cited by examiner

*Primary Examiner* — Anthan Tran

(57) ABSTRACT

An initialization method is provided for a magnetic memory element including: a data recording layer having perpendicular magnetic anisotropy which includes: a first magnetization fixed region, a second magnetization fixed region, and a magnetization free region coupled to the first magnetization fixed region and the second magnetization fixed region, the data recording layer being structure so that the coercive force of the first magnetization fixed region being different from that of the second magnetization fixed region. The initialization method includes steps of: directing the magnetizations of the first magnetization fixed region, the second magnetization fixed region and the magnetization free region in the same direction; and applying a magnetic field having both components perpendicular to and parallel to the magnetic anisotropy of the data recording layer to the data recording layer.

15 Claims, 22 Drawing Sheets

METHOD OF INITIALIZING MAGNETIC MEMORY ELEMENT

This application is the National Phase of PCT/JP2009/068573, filed Oct. 29, 2009, which claims priority based on Japanese Patent Application No. 2008-287164, filed on Nov. 7, 2008, the entire disclosure of which is incorporated herein by reference.

TECHNICAL FIELD

The present invention relates to a method of initializing a magnetic memory element, in particular, to a technique of initially introducing a domain wall into a data recording layer of the magnetic memory element.

BACKGROUND ART

Magnetic memories or magnetic random access memories (MRAM), which operate as nonvolatile memories capable of performing a high-speed operation and rewriting of an infinite number of times, have been put into practical use in specific applications and developed to improve versatility. In an MRAM, a magnetic memory element using a magnetic film is used as a memory cell and data is stored as the direction of the magnetization of the magnetic film. Typically, a magnetic memory element includes two magnetic layers and a non-magnetic layer interposed between the magnetic layers. To read data from the magnetic memory element, a magnetoresistance effect revealed between the first and second magnetic layers, specifically, a TMR effect (tunneling magnetoresistance effect) or a GMR effect (giant magnetoresistance effect) is used.

To write data into the magnetic memory element, that is, to switch the magnetization of the magnetic film, some methods have been proposed, any of which uses a current. For practical utilization of the MRAM, it is very important how much the write current can be reduced, and according to IEEE Journal of Solid-State Circuits, vol. 42, p. 830 (2007), it is required to reduce the current down to 0.5 mA or less, more preferably, to 0.2 mA or less.

The most common method of writing data into the magnetic memory element is to arrange an interconnection near the magnetic memory element, and generate a magnetic field to switch the direction of magnetization of the magnetic film by to flow a current through this interconnection. This method theoretically enables writing within one nanosecond or less, which is suitable in realizing a high-speed MRAM. However, in a case where the magnetic memory element is configured so as to ensure thermal stability and disturbance magnetic field resistance, the magnetic field for switching the magnetization of the magnetic film is generally about a few dozens of Oe and a current of about a few mA is required to generate such a magnetic field. This undesirably increases the chip area and power consumption for writing and such MRAM is inferior to other random access memories in competitiveness. In addition, when the element is reduced in size, the write current further increases, which is undesirable also in scaling.

In recent years, the following two methods have been proposed as means for addressing such a problem. The first method is spin injection magnetization reversal. According to this method, the magnetization of the magnetic film is reversed by using spin-polarized conduction electrons. In detail, in a film stack formed of a first magnetic layer having a reversible magnetization and a second magnetic layer having a fixed magnetization, the magnetization of the first magnetic layer can be reversed due to interaction between the spin-polarized conduction electrons and localized electrons in the first magnetic layer when a current is flown between the second magnetic layer and the first magnetic layer. Since the spin injection magnetization reversal occurs at a certain current density or larger, a current necessary for writing is reduced when the magnetic memory element is reduced in size. That is, the spin injection magnetization reversal method can be said to be excellent in the scaling property. However, a dielectric layer is generally provided between the first magnetic layer and the second magnetic layer and a relatively large current must be flown through the dielectric layer in a write operation, which causes problems in terms of rewriting resistance and reliability. Moreover, since a current path in the write operation is same as that in the read operation, this may cause unintentional writing in the read operation. As described above, despite of the excellent scaling property, the spin injection magnetization reversal has some obstacles to practical utilization.

On the other hand, the second method, that is, a magnetization reversal method utilizing a current-induced domain wall motion can solve the above-mentioned problems of the spin injection magnetization reversal. The MRAM utilizing the current-induced domain wall motion is disclosed in JP2005-191032A, for example. In the MRAM utilizing the current-induced domain wall motion, the directions of the magnetization at both ends of a data recording layer having reversible magnetization are generally fixed so as to be substantially antiparallel to each other. With such magnetization arrangement, the domain wall is introduced into the data recording layer. Here, as reported in Physical Review Letters, vol. 92, number 7, p. 077205, (2004), the domain wall moves in the direction of conduction electrons when a current is flown so as to penetrate the domain wall; this allows writing by flowing a current through the first magnetic layer. Since a current-induced domain wall motion occurs at a certain current density or larger, it can be said the scaling property is excellent as in spin injection magnetization reversal. In addition, the above-mentioned problems concerning spin injection magnetization reversal can be solved in the MRAM element utilizing current-induced domain wall motion, since no write current passes through the dielectric layer and thus the write current path is separated from the read current path.

In Physical Review Letters, vol. 92, number 7, p. 077205, (2004), a current density necessary for current-induced domain wall motion is about $1\times10^8$ [A/cm$^2$]. In this case, given that the width of a layer where domain wall motion occurs is 100 nm and the film thickness is 10 nm, the write current is 1 mA. This does not satisfy the above-mentioned requirement for the write current. Meanwhile, as described in Journal of Applied Physics, vol. 103, p. 07E718, (2008), it is reported that the write current can be sufficiently reduced by using material having perpendicular magnetic anisotropy as a ferromagnetic layer where the current-induced domain wall motion occurs. Thus, when the MRAM is manufactured so as to utilize the current-induced domain wall motion, it is preferable that ferromagnetic material having perpendicular magnetic anisotropy is used as a layer where domain wall motion occurs. Applied Physics Express, vol. 1, p. 011301 reports that current-induced domain wall motion was observed in the material having perpendicular magnetic anisotropy.

As described above, it is expected that the MRAM with reduced write current is provided by utilizing the current-induced domain wall motion occurring in material having perpendicular magnetic anisotropy.

In manufacturing the MRAM utilizing the current-induced domain wall motion in the writing method, the domain wall needs to be introduced into the data recording layer (that is, the layer where the domain wall motion occurs). In Applied Physics Express, vol. 1, p. 011301, a magnetic thin line is formed and then a part of the line is removed by etching to complete the magnetic thin with a stepped structure. Since the coercive force in the region having a smaller film thickness is smaller than that of the region having a larger film thickness in such a stepped structure, the domain wall is introduced using a magnetic field of appropriate magnitude so that the region having the smaller film thickness is reversed and the region having the larger film thickness is not reversed. Here, a magnetic field perpendicular to the substrate surface is used as the external magnetic field. Initial introduction of a domain wall into a data recording layer in a manufacturing process is hereinafter referred to as "initialization".

However, according to such an initialization method in which a stepped structure is provided and a domain wall is introduced by using a magnetic field perpendicular to the substrate surface, the magnitude of the applied magnetic field is limited within a certain allowed range. When the allowed range is narrow, problems such as reduction in yield occur in manufacturing large-capacity magnetic memories. Therefore, it is desired that the allowed range of the external magnetic field in introducing the domain wall into the data recording layer is as large as possible.

CITATION LIST

Patent Literature

Patent literature 1: JP2005-191032A

Non-Patent Literature

Non-patent literature 1: IEEE Journal of Solid-State Circuits, vol. 42, p. 830 (2007)
Non-patent literature 2: Physical Review Letters, vol. 92, number 7, p. 077205 (2004)
Non-patent literature 3: Journal of Applied Physics, vol. 103, p. 07E718 (2008)
Non-patent literature 4: Applied Physics Express, vol. 1, p. 011301

DISCLOSURE OF INVENTION

Therefore, an object of the present invention is to provide a technique of increasing an allowed range of the magnitude of a magnetic field to be applied for initialization of a magnetic memory element provided with a data recording layer having perpendicular magnetic anisotropy.

In one aspect of the present invention, provided is an initialization method of a magnetic memory element including: a data recording layer having perpendicular magnetic anisotropy which includes: a first magnetization fixed region, a second magnetization fixed region, and a magnetization free region coupled to the first magnetization fixed region and the second magnetization fixed region, the coercive force of the first magnetization fixed region being different from that of the second magnetization fixed region. The initialization method includes steps of: directing the magnetizations of the first magnetization fixed region, the second magnetization fixed region and the magnetization free region in the same direction; and applying a magnetic field having both components perpendicular to and parallel to the magnetic anisotropy of the data recording layer to the data recording layer.

According to the present invention, a technique is provided which increases the allowed range of the magnitude of the magnetic field applied for the initialization of the magnetic memory element provided with the data recording layer having perpendicular magnetic anisotropy.

EMBODIMENTS OF INVENTION (Memory Configuration)

Figure 1A:
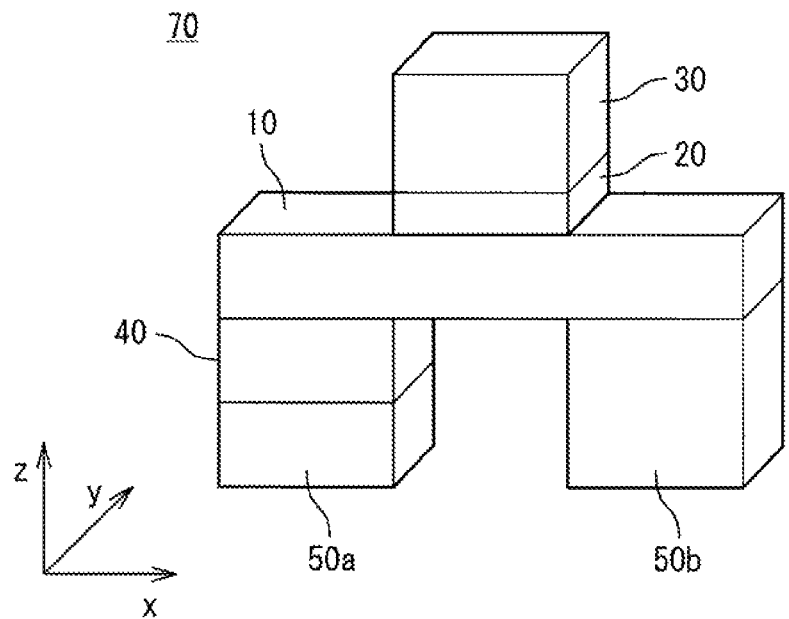
FIG. 1A is a perspective view showing the configuration of a magnetic memory element in one embodiment of the present invention.
Figure 1B:
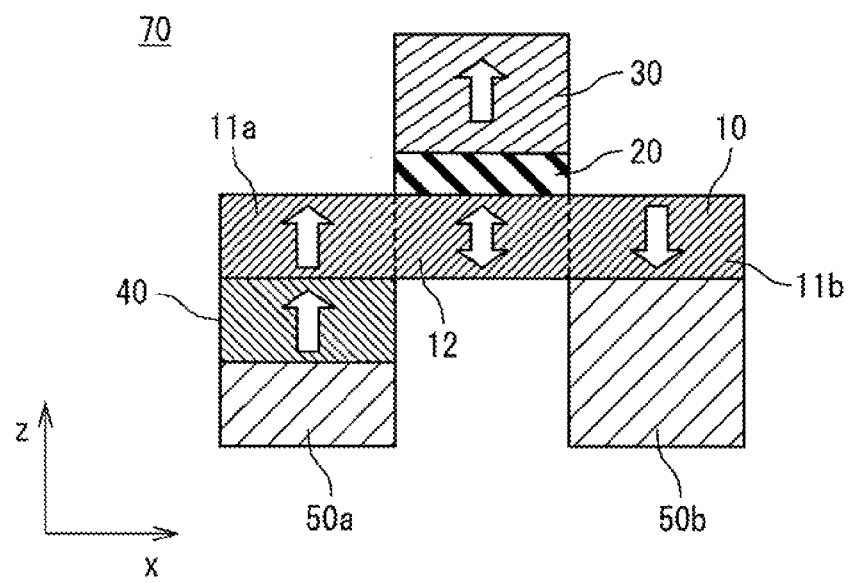
FIG. 1B is a sectional view showing the configuration of the magnetic memory element according in one embodiment of the present invention.
Figure 1C:
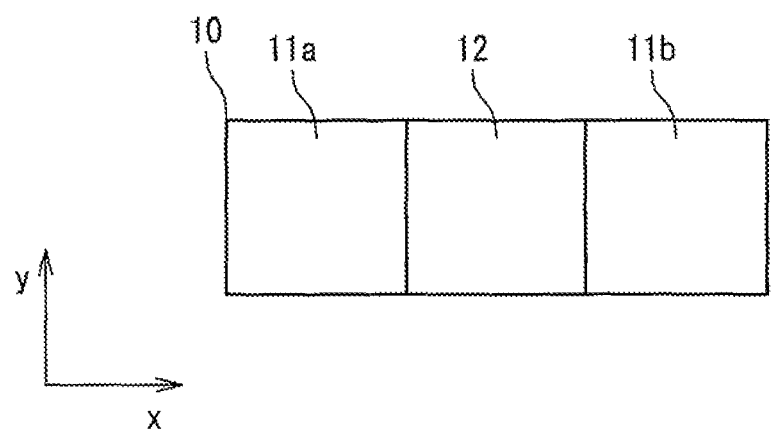
FIG. 1C is a plan view showing the configuration of the magnetic memory element according in one embodiment of the present invention.

FIGS. 1A to 1C are diagrams schematically showing an example of the structure of a magnetic memory element 70 in one embodiment of the present invention. Here, FIG. 1A is a perspective view, FIG. 1B is a sectional view and FIG. 1C is a plan view of the magnetic memory element 70. Hereinafter, a description will be given using an x-y-z coordinate system. In the x-y-z coordinate system, the z axis represents a direction perpendicular to the substrate and the x axis and y axis represent directions parallel to the substrate.

The magnetic memory element 70 includes a data recording layer 10, a first nonmagnetic layer 20 and a first magnetization fixed layer 30. The data recording layer 10 is a ferromagnetic film that records 1-bit data as the direction of the magnetization and the first magnetization fixed layer 30 is a ferromagnetic film having a magnetization fixed to a specific direction. Both of the data recording layer 10 and the first magnetization fixed layer 30 have perpendicular magnetic anisotropy. The first nonmagnetic layer 20 is provided between the data recording layer 10 and the first magnetization fixed layer 30.

As shown in FIGS. 1B and 1C, the data recording layer 10 includes a first magnetization fixed region 11a, a second magnetization fixed region 11b and a magnetization free region 12. Both of the magnetizations of the first magnetization fixed region 11a and the second magnetization fixed region 11b are fixed. The direction of the magnetization of the first magnetization fixed region 11a is antiparallel to that of the second magnetization fixed region 11b. The magnetization free region 12 has a reversible magnetization. Data are stored in the data recording layer 10 as the direction of magnetization of the magnetization free region 12.

In the data recording layer 10, a domain wall is formed either at the boundary between the first magnetization fixed region 11a and the magnetization free region 12 or at the boundary between the second magnetization fixed region 11b and the magnetization free region 12, depending on the direction of the magnetization of the magnetization free region 12. Although the magnetization of the first magnetization fixed region 11a is fixed to the +z direction and the magnetization of the second magnetization fixed region 11b is fixed to the −z direction in FIGS. 1A to 1C, the magnetization of the first magnetization fixed region 11a may be fixed to the −z direction and magnetization of the second magnetization fixed region 11b may be fixed to the +z direction. Herein, it is assumed that the second magnetization fixed region 11b is located in the positive direction along the x-axis with respect to the first magnetization fixed region 11a.

In this embodiment, the first nonmagnetic layer 20 is formed of dielectric material, whereas the magnetization free region 12, the first nonmagnetic layer 20 and the first magnetization fixed layer 30 of the data recording layer 10 constitutes magnetic tunnel junction (MTJ). The resistance of this MTJ varies due to the TMR (Tunneling Magneto-Resistance) effect depending on the direction of the magnetization of the magnetization free region 12. As described later, the TMR effect revealed by MTJ is utilized to read data from the data recording layer 10.

The magnetic memory element 70 further includes an auxiliary ferromagnetic layer 40 and electrode layers 50a, 50b. The auxiliary ferromagnetic layer 40 is formed of ferromagnetic material. The auxiliary ferromagnetic layer 40 is joined to the first magnetization fixed region 11a and functions as a domain wall introduction mechanism for introducing the domain wall into the data recording layer 10. That is, the auxiliary ferromagnetic layer 40 causes a difference between the effective coercive forces of the first magnetization fixed region 11a and the second magnetization fixed region 11b, thereby directing the magnetization directions of the first magnetization fixed region 11a and the second magnetization fixed region 11b to be antiparallel to each other. When the direction of the magnetization of the first magnetization fixed region 11a is antiparallel to that of the second magnetization fixed region 11b, the domain wall is introduced into either the boundary between the first magnetization fixed region 11a and the magnetization free region 12 or the boundary between the second magnetization fixed region 11b and the magnetization free region 12. Preferably, the auxiliary ferromagnetic layer 40 has perpendicular magnetic anisotropy. Meanwhile, the electrode layers 50a and 50b function as a current introduction mechanism for introducing a write current or a read current into the magnetic memory element 70. The electrode layer 50a is joined to the auxiliary ferromagnetic layer 40 and the electrode layer 50b is joined to the second magnetization fixed region 11b of the data recording layer 10.

The number of the auxiliary ferromagnetic layers 40 is optional. That is, although FIGS. 1A to 1C show the configuration in which only one auxiliary ferromagnetic layer 40 is provided, two or more auxiliary ferromagnetic layers 40 may be provided. Details thereof will be described later. Further, although FIGS. 1A to 1C show the configuration in which the auxiliary ferromagnetic layer 40 is provided below the data recording layer 10 and the first nonmagnetic layer 20 and the first magnetization fixed layer 30 are provided above the data recording layer 10, the arrangement of the data recording layer 10, the first nonmagnetic layer 20, the first magnetization fixed layer 30 and the auxiliary ferromagnetic layer 90 may be also changed in various ways. Details thereof will be described later.

Figure 2A:
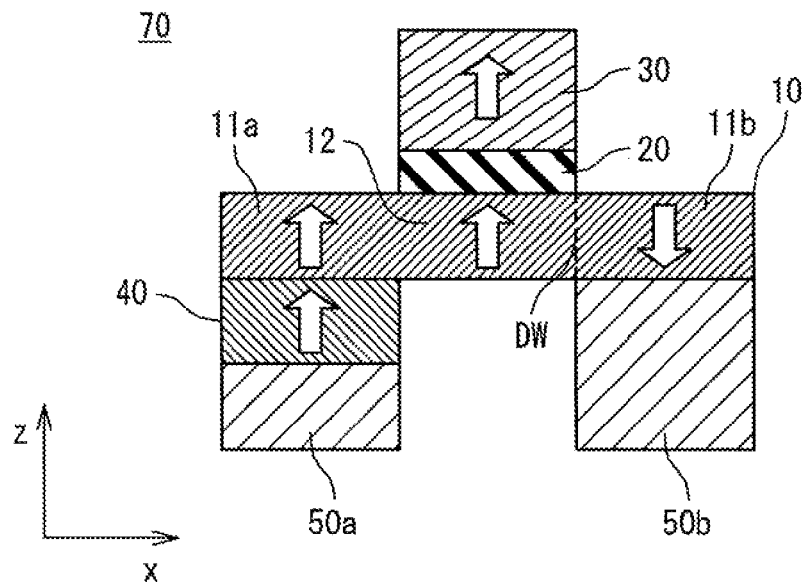
FIG. 2A is a diagram showing the magnetization state in a case where the magnetic memory element is placed in the "0" state.
Figure 2B:
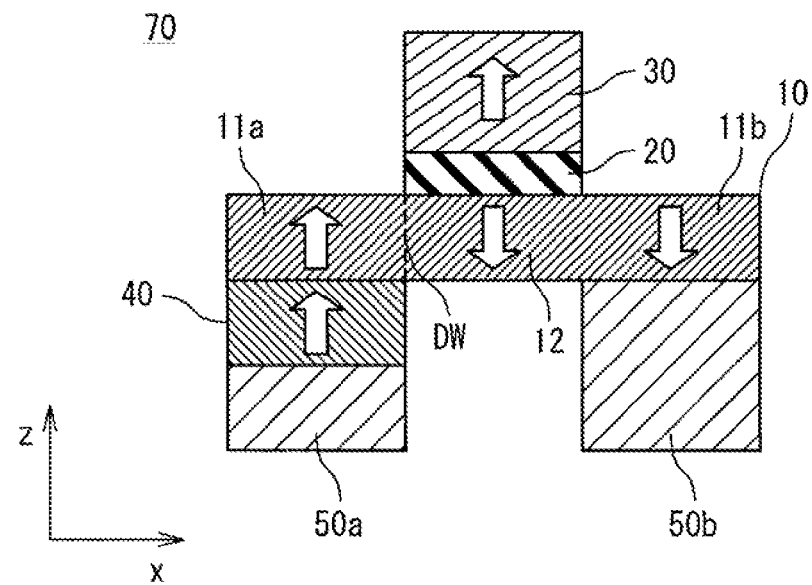
FIG. 2B is a diagram showing the magnetization state in a case where the magnetic memory element is placed in the "1" state.

As shown in FIGS. 2A and 2B, the magnetic memory element 70 have two allowed states, one state is assigned to data "0" and the other state is assigned to data "1". FIG. 2A shows the magnetization state in the magnetic memory element 70 in the "0" state and FIG. 2B shows a magnetization state in the magnetic memory element 70 in the "1" state. In this embodiment, the magnetization of the first magnetization fixed region 11a is fixed in the +z direction and magnetization of the second magnetization fixed region 11b is fixed in the −z direction.

In the "0" state shown in FIG. 2A, the magnetization of the magnetization free region 12 is directed in the +z direction. In this case, a domain wall DW is formed at the boundary between the magnetization free region 12 and the second magnetization fixed region 11b. In the "1" state shown in FIG. 2B, the magnetization of the magnetization free region 12 is directed in the −z direction. In this case, the domain wall DW is formed in the boundary between the magnetization free region 12 and the first magnetization fixed region 11a.

It would be apparent to those skilled in the art that the state shown in FIG. 2A may be assigned to the "1" state and the state shown in FIG. 2B may be assigned to the "0" state.

Hereinafter; a description is given of materials used for the data recording layer 10, the first nonmagnetic layer 20, the first magnetization fixed layer 30 and the auxiliary ferromagnetic layer 40 of the magnetic memory element 70. It should be noted that the present invention may be implemented by using materials other than the below-mentioned materials.

The data recording layer 10 is made of ferromagnetic material having perpendicular magnetic anisotropy. For this reason, it is preferable that the data recording layer 10 contains Fe, Co and Ni. Known as materials having perpendicular magnetic anisotropy are Co, Co—Pt, Co—Pd, Co—Cr, Co—Pt—Cr, Co—Cr—Ta, Co—Cr—B, C o-Cr—Pt—B, Co—Cr—Ta—B, Co—Ni—Pt, Co—V, Co—Mo, Co—W, Co—Ti, Co—Ru, Co—Rh, Fe—Pt, Fe—Pd, Fe—Co—Pt, Fe—Co—Pd, Fe—Ni—Pt, Mn—Al, Mn—Bi, Sm—Co, Gd—Fe—Co, Tb—Fe—Co, Gd—Tb—Fe—Co and the like, and these materials may be used for the data recording layer 10. In addition, perpendicular magnetic anisotropy can be revealed instead, by laminating a layer containing any one selected from Fe, Co and Ni and a different layer. Specifically, a Co/Pd film stack, a Co/Pt film stack, a Co/Ni film stack and a Fe/Au film stack may be used as the data recording layer 10.

In this embodiment in which an MTJ is formed in the magnetic memory element 70, the first nonmagnetic layer 20 is made of dielectric material. Specifically, Mg—O, Al—O, Al—N, Ni—O, Hf—O and the like may be used for the first nonmagnetic layer 20. Conductive materials such as semiconductors and metal materials may be also used for the first nonmagnetic layer 20. Specifically, Al, Cr, Cu and the like may be used for the first nonmagnetic layer 20. When the conductive material is used for the first nonmagnetic layer 20, a CPP-GMR (Current Perpendicular to Plane Giant Magneto-Resistance) effect in place of the TMR (Tunneling Magneto-Resistance) effect is utilized to read data.

Similarly to the data recording layer 10, the first magnetization fixed layer 30 is made of ferromagnetic material having perpendicular magnetic anisotropy. Specific materials which may be used for the first magnetization fixed layer 30 are same as those for the data recording layer 10. It is preferable that magnetization of the first magnetization fixed layer 30 is strongly fixed and, to this end, an antiferromagnetic layer may be provided adjacent to the first magnetization fixed layer 30. Alternatively, a film stack that functions as an SAF (synthetic antiferromagnet) may be used as the first magnetization fixed layer 30. These are apparent to those skilled in the art, and thus are not illustrated.

Various materials may be used for the auxiliary ferromagnetic layer 40. For example, the above-mentioned ferromagnetic materials that can be used for the data recording layer 10 may be employed. Other embodiments of the auxiliary ferromagnetic layer 40 will be described later.

Conductive material is used for the electrode layers 50a and 50b. Specifically, Cu, Al, Ta, W, Ru and the like may be used for the electrode layers 50a and 50b.

Figure 5:
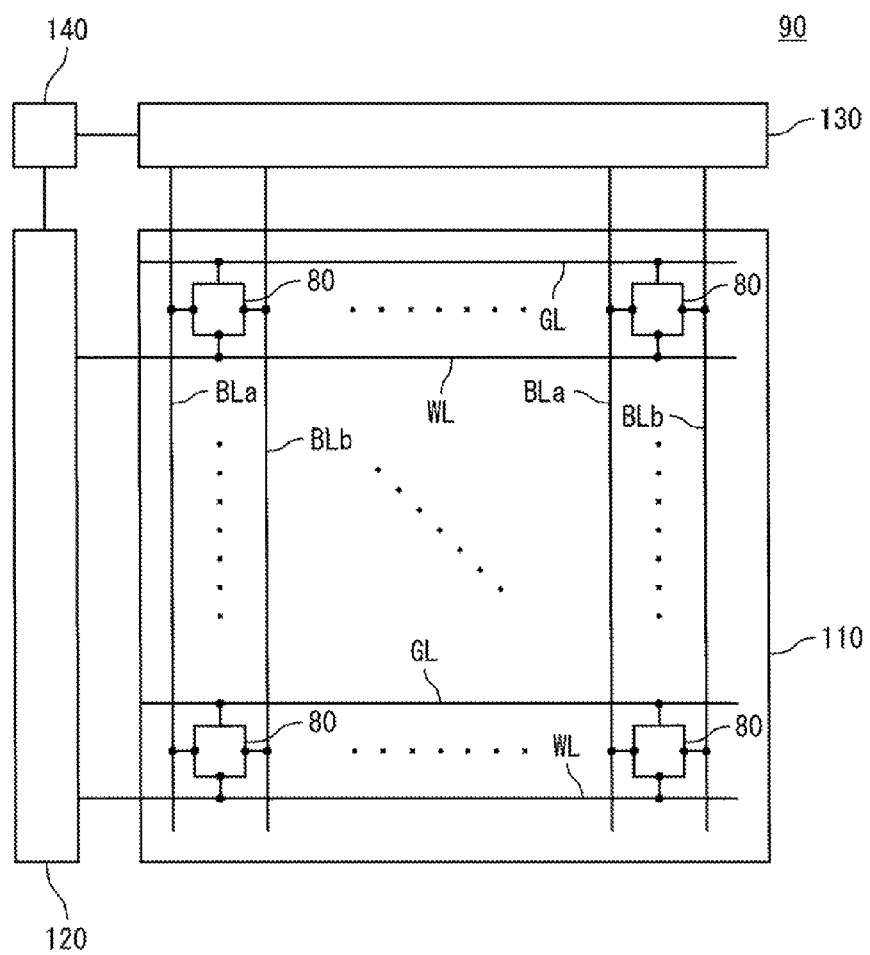
FIG. 5 is a block diagram showing the configuration of a magnetic memory in one embodiment of the present invention.

In the magnetic memory in this embodiment, the above-mentioned magnetic memory element 70 is integrated into each memory cell. FIG. 5 is a block diagram showing an example of the configuration of a magnetic memory 90 in this embodiment. The magnetic memory 90 includes a memory cell array 110, an X driver 120, a Y driver 130 and a controller 140. The memory cell array 110 has a plurality of magnetic memory cells 80 arranged in an array. As described later, the magnetic memory element 70 is integrated into each of the magnetic memory cells 80. Provided in the memory cell array 110 are word lines WL and ground lines GL which are extended in the row direction and bit line pairs BLa and BLb which are extended in the column direction. Each magnetic memory cell 80 is connected to a word line WL, a ground lines GL and a bit line pair BLa and BLb. The X driver 120 is connected to the plurality of word lines WL to drive a selected word line connected to the magnetic memory cell 80 to be accessed among the plurality of word lines WL. The Y driver 130 is connected to the plurality of bit line pairs BLa and BLb to place the respective bit lines into the states adapted to data writing or data reading. The controller 140 controls each of the X driver 120 and the Y driver 130 according to data writing or data reading.

Figure 6:
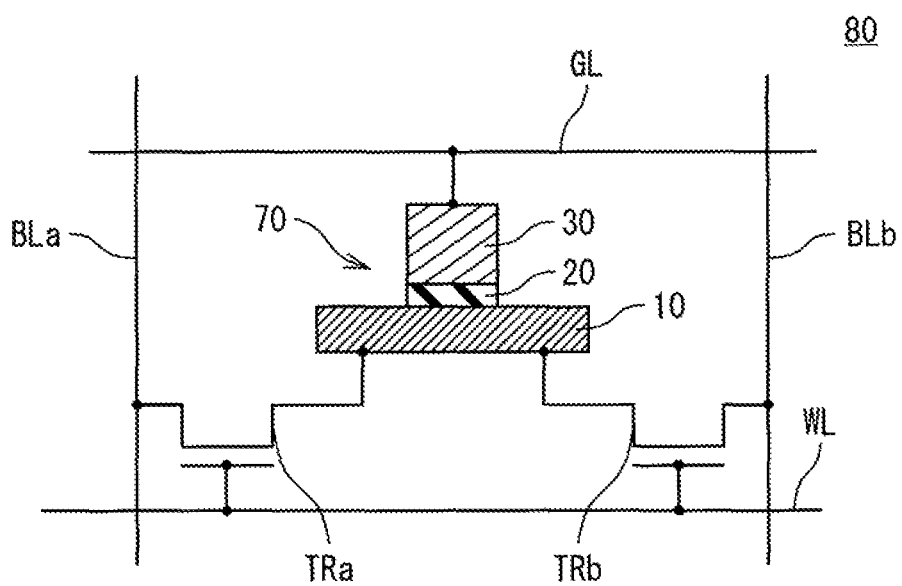
FIG. 6 is a circuit diagram showing the configuration of a magnetic memory cell in the magnetic memory shown in FIG. 5.

FIG. 6 is a circuit diagram showing an example of the configuration of each magnetic memory cell 80. In this embodiment, each magnetic memory cell 80 is comprised of the magnetic memory element 70 and two MOS transistors TRa and TRb. The magnetic memory element 70 is a three-terminal element. A terminal connected to the first magnetization fixed layer 30 is connected to the ground line GL used for reading. A terminal (that is, electrode layer 50a) connected to the first magnetization fixed region 11a is connected to one source/drain of the MOS transistor TRa and the other source/drain of the MOS transistor TRa is connected to the bit line BLa. A terminal (that is, electrode layer 50b) connected to the second magnetization fixed region 11b is connected to one source/drain of the MOS transistor TRb and the other source/drain of the MOS transistor TRb is connected to the bit line BLb. The gate of the MOS transistors TRa and TRb are commonly connected to the word line WL.

(Write Operation and Read Operation)

Figure 3A:
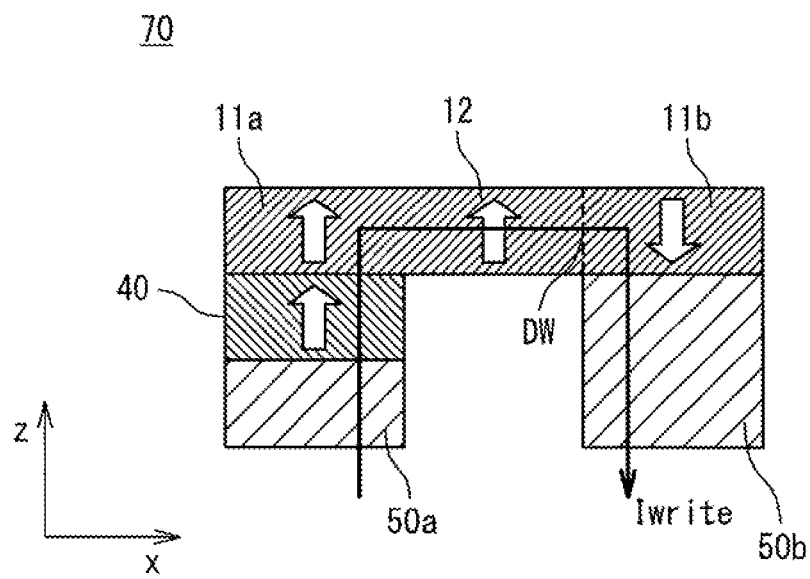
FIG. 3A is a diagram showing a write operation for writing data "1" into the magnetic memory element in the "0" state.
Figure 3B:
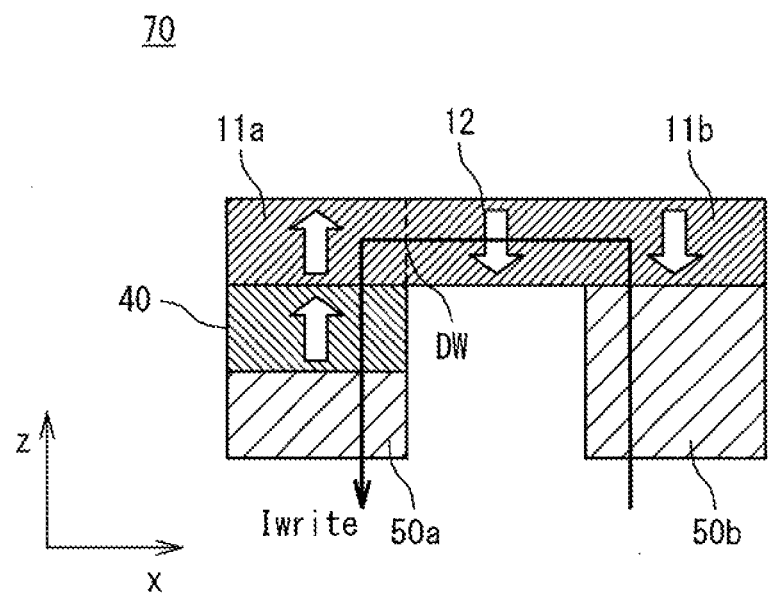
FIG. 3B is a diagram showing a write operation for writing data "0" into the magnetic memory element in the "1" state.

Hereinafter, a description is given of data writing into the magnetic memory element 70 of each magnetic memory cell 80 and data reading from the magnetic memory element 70. FIGS. 3A and 3B schematically show a method of writing data into the magnetic memory element 70. For simplification, FIGS. 3A and 3B do not show the first nonmagnetic layer 20 and the first magnetization fixed layer 30.

As shown in FIGS. 3A and 3B, data writing into the magnetic memory element 70 is achieved by flowing a write current Iwrite through the data recording layer 10 in the direction from the first magnetization fixed region 11a to the second magnetization fixed region 11b or in the opposite direction. More specifically, in the write operation, the word line WL associated with the selected magnetic memory cell 80 is set to the high level to turn on the MOS transistors TRa and TRb of the selected magnetic memory cell 80. One of the bit line pair BLa and BLb associated with the selected magnetic memory cell 80 is set to the high level and the other is set to the low level (or the ground level). Thereby, the write current Iwrite flows from the bit line BLa to the bit line BLb or from the bit line BLb to the bit line BLa, in the data recording layer 10. In other words, the write current Iwrite flows in the direction from the first magnetization fixed region 11a to the second magnetization fixed region 11b or in the opposite direction.

In detail, as shown in FIG. 3A, when the write current Iwrite is introduced in the direction from the first magnetization fixed region 11a to the second magnetization fixed region 11b in the data recording layer 10 for the magnetic memory element 70 placed in the "0" state defined in FIG. 2A, conduction electrons flow from the second magnetization fixed region 11b to the first magnetization fixed region 11a through the magnetization free region 12. This results in that a spin transfer torque (STT) is applied to the domain wall DW formed at the boundary between the second magnetization fixed region 11b and the magnetization free region 12 and the domain wall moves in the negative direction of the x axis. That is, a current-induced domain wall motion occurs. Here, the domain wall DW stops at the boundary between the first magnetization fixed region 11a and the magnetization free region 12, since the write current Iwrite decreases at any position located in the negative direction along the x-axis with respect to the boundary between the first magnetization fixed region 11a and the magnetization free region 12. This state corresponds to the "1" state defined in FIG. 2B. In this manner, data "1" is successfully written into the magnetic memory element 70.

On the other hand, as shown in FIG. 3B, when the write current Iwrite is introduced in the direction from the second magnetization fixed region 11b to the first magnetization fixed region 11a in the data recording layer 10 for the magnetic memory element 70 placed in the "1" state defined in FIG. 2B, conduction electrons flow from the second magnetization fixed region 11b to the first magnetization fixed region 11a through the magnetization free region 12. This results in that a spin transfer torque is applied to the domain wall DW formed at the boundary between the second magnetization fixed region 11b and the magnetization free region 12 and the domain wall DW moves in the positive direction along the x axis. That is, a current-induced domain wall motion occurs. Here, the domain wall DW stops at the boundary between the second magnetization fixed region 11b and the magnetization free region 12 since the write current decreases at any position located in the positive direction along the x axis with respect to to the boundary between the second magnetization fixed region 11b and the magnetization free region 12. This state corresponds to the "0" state defined in FIG. 2A. In this manner, data "0" is successfully written into the magnetic memory element 70.

It should be noted that the state does not change when data "0" is written into the magnetic memory element 70 placed in the "0" state, and when data "1" is written into the magnetic memory element 70 placed in the "1" state. That is, overwriting is allowed for the magnetic memory element 70 in this embodiment.

Figure 4A:
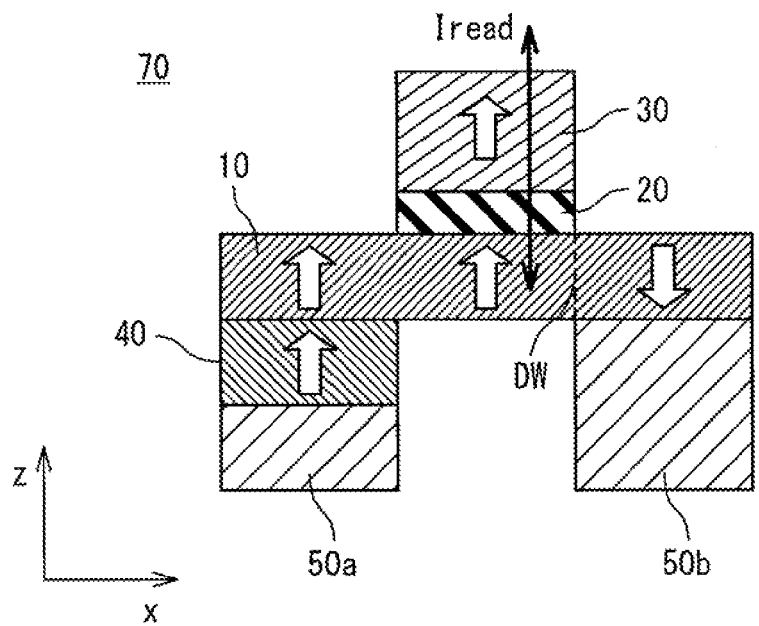
FIG. 4A is a diagram showing a read operation for reading data from the magnetic memory element in the "0" state.
Figure 4B:
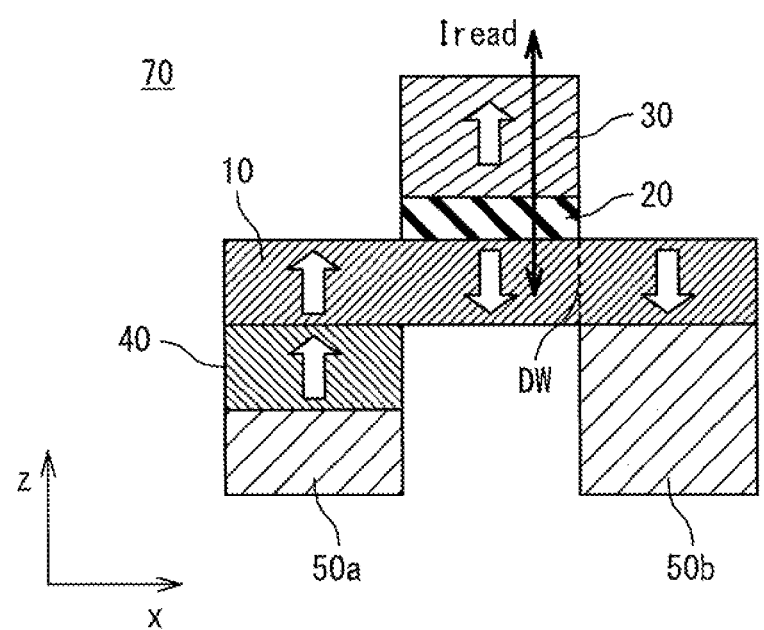
FIG. 4B is a diagram showing a read operation for reading data from the magnetic memory element in the "1" state.

In the data reading operation from the magnetic memory element 70, as shown in FIGS. 4A and 4B, a read current Iread is flowed in the direction penetrating the magnetic tunnel junction constituted of the data recording layer 10, the first nonmagnetic layer 20 and the first magnetization fixed layer 30. In detail, the word line WL associated with the selected magnetic memory cell 80 is set to the high level in the reading operation to thereby turn on the MOS transistors TRa and TRb of the selected magnetic memory cell 80. Further, the bit line BLa associated with the selected magnetic memory cell 80 is set to the open state and the corresponding bit line BLb is set to the high level. As a result, the read current Iread flows from the bit line BLb to the ground line GL through the MOS transistor TRb and the magnetic tunnel junction of the magnetic memory element 70. This effectively achieves reading based on the TMR effect. The read current Iread may be flown from the data recording layer 10 to the first magnetization fixed layer 30 or may be flown in the opposite direction.

When the read current Iread is flown for the magnetic memory element 70 placed in the "0" state as shown in FIG. 4A, a low resistance is achieved, since the magnetizations are placed in the parallel state in the magnetic tunnel junction. When the read current Iread is flown for the magnetic memory element 70 placed in the "1" state as shown in FIG. 4B, on the other hand, a high resistance is achieved, since the magnetizations are in the antiparallel state in the magnetic tunnel junction. In this manner, data stored in the magnetic memory element 70 can be identified based on the change in the resistance value in the magnetic tunnel junction.

(Initialization of Magnetic Memory Element)

Next, a description is given of a method of introducing the domain wall into the data recording layer 10 of the above-mentioned magnetic memory element 70, that is, a method of initializing the magnetic memory element 70.

1. Conventional Method and Problems

First, a conventional initializing method of the magnetic memory element and its problems will be described.

Figure 7A:
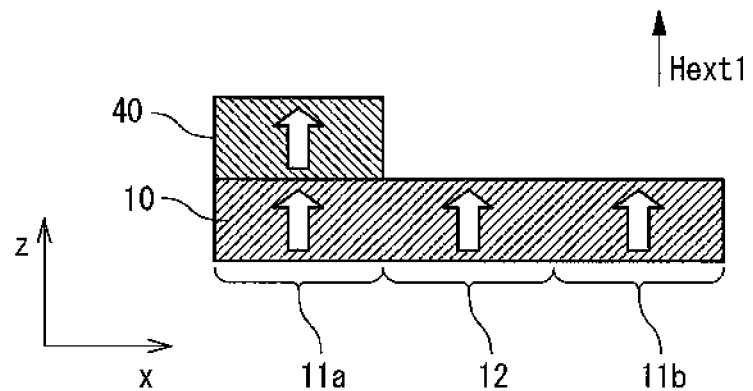
FIG. 7A is a diagram showing a conventional initialization method of a magnetic memory element.
Figure 7B:
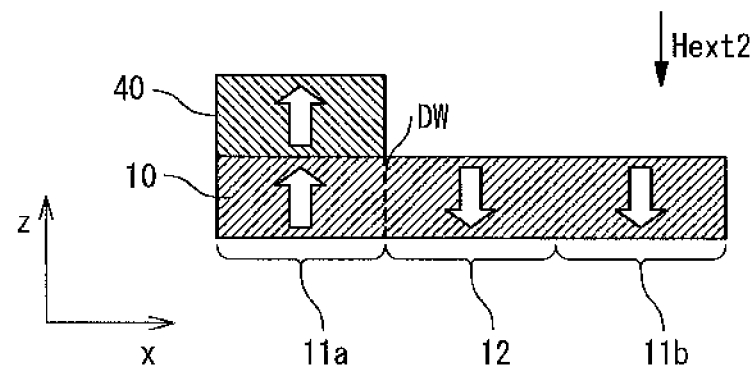
FIG. 7B is a diagram showing the initialization method of the conventional magnetic memory element.

FIGS. 7A and 7B schematically show the conventional initialization method. According to a technique disclosed in non patent literature 4, a method shown in FIGS. 7A and 7B is used. In the following description, it is assumed that, as shown in FIG. 7A, the data recording layer 10 includes the first magnetization fixed region 11a, the second magnetization fixed region 11b and the magnetization free region 12 as described above, and the auxiliary ferromagnetic layer 40 is joined to the first magnetization fixed region 11a. Moreover, it is also assumed that both of the data recording layer 10 and the auxiliary ferromagnetic layer 40 have perpendicular magnetic anisotropy and the coercive force of the auxiliary ferromagnetic layer 40 is larger than that of the data recording layer 10.

In the conventional method, as shown in FIG. 7A, a sufficiently large external magnetic field Hext1 is first applied in the perpendicular direction. In FIG. 7A, the magnetization state in a case where the external magnetic field Hext1 is applied in the +z direction is represented by arrows. As shown in FIG. 7A, when the external magnetic field Hext1 is applied, the magnetizations of the first magnetization fixed region 11a, the second magnetization fixed region 11b, the magnetization free region 12 and the auxiliary ferromagnetic layer 40 are all directed in the +z direction.

Next, an appropriate external magnetic field Hext2 is applied in the opposite direction to the direction of the external magnetic field Hext1 applied first, that is, the −z direction in this case. At this time, no magnetization reversal occurs in the laminated part formed of the auxiliary ferromagnetic layer 40 and the first magnetization fixed region 11a due to the large coercive force thereof, while a magnetization reversal is induced in the second magnetization fixed region 11b and the magnetization free region 12 due to the small coercive forces.

As a result, the domain wall DW is formed at the boundary between the first magnetization fixed region 11a and the magnetization free region 12. This state corresponds to the "1" state defined in FIG. 2B.

The above-mentioned method of introducing the domain wall, however, magnetization reversal of the second magnetization fixed region 11b and the magnetization free region 12 is not induced when the external magnetic field Hext2 applied in FIG. 7B is too small. Conversely, when the external magnetic field Hext2 is too large, magnetization reversal is induced also in the laminated part formed of the first magnetization fixed region 11a and the auxiliary ferromagnetic layer 40. In other words, the external magnetic field Hext2 used in FIG. 7B must fall within a certain allowed range. The allowed range of the external magnetic field to be applied in the initialization is hereinafter referred to as an initialization margin. When the initialization margin is small, an increased number of elements exhibit an unsuccessfully initialized memory state, especially in a large-capacity memory device, resulting in a reduced yield. Therefore, it is desired that the initialization margin is as large as possible.

Figure 8A:
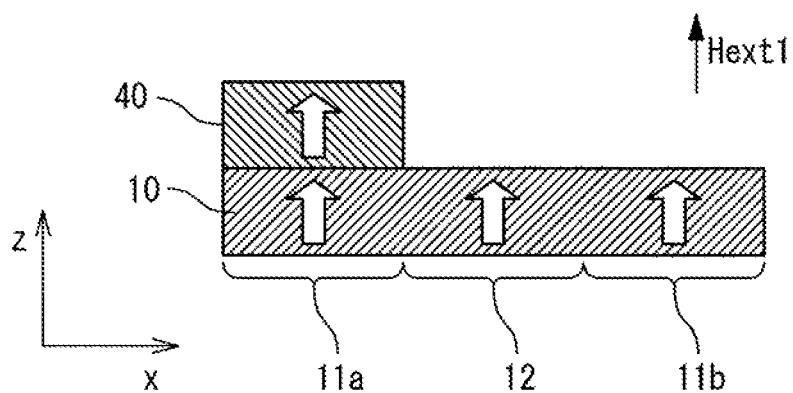
FIG. 8A is a diagram showing the magnetization state of the magnetic memory element corresponding to the A state of a magnetization curve shown in FIG. 8D.
Figure 8B:
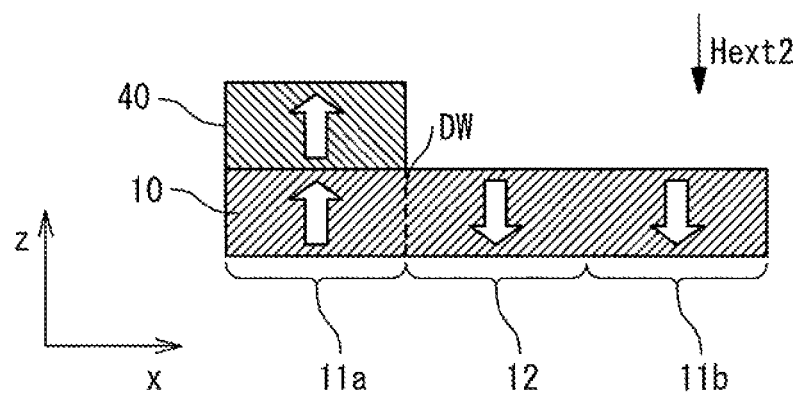
FIG. 8B is a diagram showing the magnetization state of the magnetic memory element corresponding to a B state of the magnetization curve in FIG. 8D.
Figure 8C:
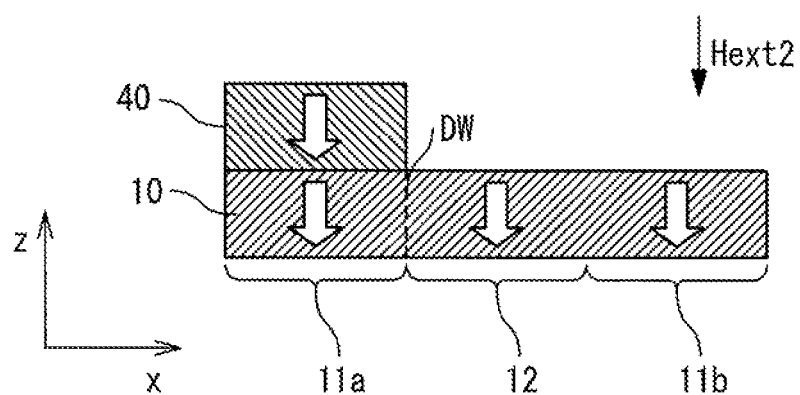
FIG. 8C is a diagram showing the magnetization state of the magnetic memory element corresponding to the C state of the magnetization curve in FIG. 8D.
Figure 8D:
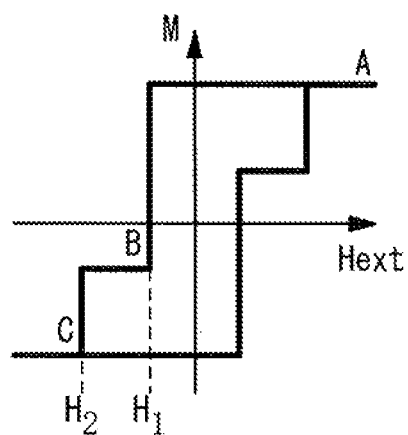
FIG. 8D is a diagram showing the magnetization curve of the conventional magnetic memory element.

The initialization method described with reference to FIGS. 7A and 7B has a difficulty in achieving a large initialization margin. The reason for this will be described referring to FIGS. 8A to 8D. FIGS. 8A to 8C schematically show the magnetization responses of respective regions in a system having a stepped structure as shown in FIGS. 7A and 7B (hereinafter, referred to as stepped structure), which are made of materials having different coercive forces. FIG. 8D shows a magnetization curve representing the response of the total magnetization of the stepped structure to the external magnetic field. FIG. 8A shows the magnetization state corresponding to the point A of the magnetization curve in FIG. 8D (hereinafter referred to as "A state"), FIG. 8B shows a magnetization state corresponding to the point B (hereinafter referred to as "B state") and FIG. 8C shows the magnetization state corresponding to the point C (hereinafter referred to as "C state"). The threshold magnetic field of the switching from the A state to the B state is defined as H1 and the threshold magnetic field of the switching from the B state to the C state is defined as H2. As described referring to FIGS. 7A and 7B, the difference between the threshold magnetic fields H1 and H2 is the initialization margin in this system.

It should be noted here that the magnetization reversal mechanism of the second magnetization fixed region 11b and the magnetization free region 12 in the switching from the A state to the B state is different from that of the first magnetization fixed region 11a and the auxiliary ferromagnetic layer 40 in the switching from the B state to the C state. Magnetization reversal is classified into nucleation-type magnetization reversal and domain wall motion-type magnetization reversal. In a perpendicular magnetization film, magnetization reversal occurs with a magnetic field that is smaller than the anisotropic magnetic field (Hk), and the occurrence of magnetization reversal needs to satisfy following two conditions:

(1) a reversed nucleus having a magnetization in the parallel direction to the external magnetic field is formed (nucleation), and (2) an axis parallel in the parallel direction to the external magnetic field can develop, that is, a domain wall motion occurs.

Given that the magnetic field necessary for nucleation of (1) is defined as the nucleation magnetic field and the magnetic field necessary for domain wall motion in (2) is defined as the domain wall motion magnetic field, the magnetization reversal mechanism can be distinguished based on which of the nucleation magnetic field and the domain wall motion magnetic field is larger. Hereinafter, when the nucleation magnetic field is larger, the magnetization reversal mechanism is referred to as nucleation-type magnetization reversal, and when the domain wall motion magnetic field is larger, the magnetization reversal mechanism is referred to as domain wall motion-type magnetization reversal.

In the example shown in FIGS. 8A to 8D, the magnetization reversal of the second magnetization fixed region 11b and the magnetization free region 12 in the switching from the A state to the B state is nucleation-type magnetization reversal in general. On the other hand, in the switching from the B state to the C state, the magnetization reversal of the first magnetization fixed region 11a and the auxiliary ferromagnetic layer 40 is domain wall motion-type magnetization reversal. This results from that the domain wall is formed at the boundary between the first magnetization fixed region 11a and the magnetization free region 12 in the B state and functions as the reversed nucleus, that is, the magnetization reversal occurs after the reversal nucleus is already generated.

For a Co/Pt-based film stack, which is one typical perpendicular magnetic anisotropy material, the nucleation magnetic field of a patterned element is of the order of 1000 (Oe), while the domain wall motion magnetic field is of the order of 100 (Oe). In this case, when the magnetization state is tried to be switched from the A state to the B state by nucleation-type magnetization reversal, the magnetization state is undesirably switched at the same time from the B state to the C state by domain wall motion-type magnetization reversal and thus, the initialization margin becomes 0. Although the initialization margin can be set to a limited value in a different material system, it is difficult to ensure a sufficiently large initialization margin.

2. Principle of Initialization Method of this Embodiment

In this embodiment, an external magnetic field having both of components in the direction perpendicular to the substrate surface and in the direction parallel to the substrate surface is used in order to enlarge the initialization margin. In other words, an external magnetic field having both of components in the direction of the magnetic anisotropy of the data recording layer 10 (the direction perpendicular to the substrate surface) and in the direction perpendicular to this direction (the direction parallel to the substrate surface) is used. A description is given of the principle with reference to FIG. 9.

In the example shown in FIGS. 8A to 8C, as described above, the switching from the A state to the B state is based on nucleation-type magnetization reversal and the switching from the B state to the C state is based on domain wall motion-type magnetization reversal. The nucleation-type magnetization reversal reveals an angle dependency according to the Stoner-Wohlfarth theory, while the domain wall motion-type magnetization reversal reveals an angle dependency according to the 1/cos θ rule. According to the Stoner-Wohlfarth theory, the dependency of nucleation-type magnetization reversal on the angle θ of the threshold magnetic field Hth is expressed as the following expression:

$$Hth \propto (\cos 2/3\theta + \sin 2/3\theta) - 3/2$$

Meanwhile, the dependency of domain wall motion-type magnetization reversal on the angle θ of the threshold magnetic field Hth is expressed as the following expression:

$$Hth \propto 1/\cos \theta$$

Here, θ is the angle formed between the direction of magnetic anisotropy of the ferromagnetic material and the direction of the external magnetic field.

Figure 9:
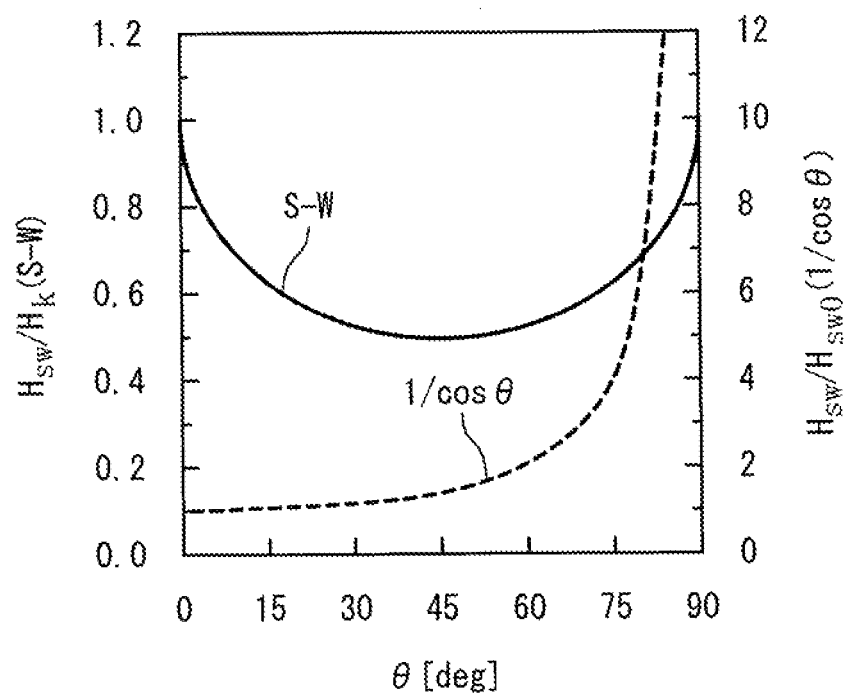
FIG. 9 is a graph showing calculation results of the angle dependency of the threshold magnetic field of nucleation-type magnetization reversal and the angle dependency of the threshold magnetic field of domain wall motion-type magnetization reversal.

FIG. 9 shows calculation results of the angle dependencies of the threshold magnetic field of the nucleation-type magnetization reversal and the threshold magnetic field of the domain wall motion-type magnetization reversal. The vertical axis represents the threshold magnetic field and the horizontal axis represents the angle from the easy axis. The curve indicated by the symbol "S-W" corresponds to the threshold magnetic field of the nucleation-type magnetization reversal and the curve indicated by the symbol "1/cos θ" corresponds to the threshold magnetic field of the domain wall motion-type magnetization reversal. As shown in FIG. 9, in the nucleation-type magnetization reversal which complies with the Stoner-Wohlfarth theory, the threshold magnetic field decreases as the angle θ increases from 0 degree, becomes minimum when the angle θ reaches 45 degrees and increases when the angle θ exceeds 45 degrees. The threshold magnetic field at the angle θ of 90 degrees has the same value as that at the angle θ of 0 degree. Meanwhile, in domain wall motion-type magnetization reversal which complies with the 1/cos θ rule, the threshold magnetic field increases as the angle θ is increased and a rapid increase is observed in a region where the angle θ is large.

Figure 10A:
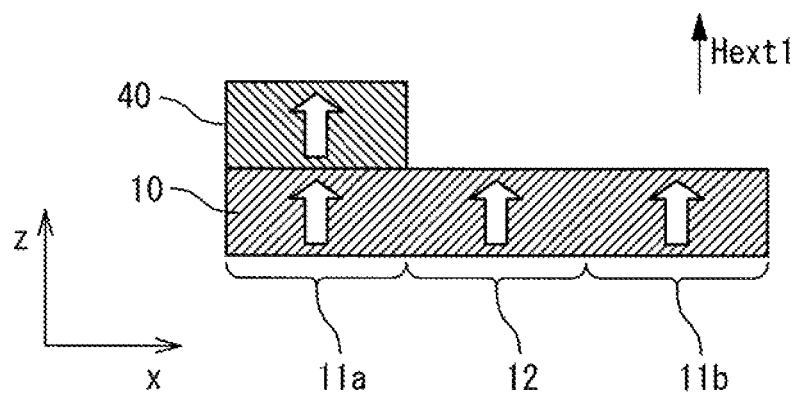
FIG. 10A is an initialization method of the magnetic memory element in one embodiment of the present invention.
Figure 10B:
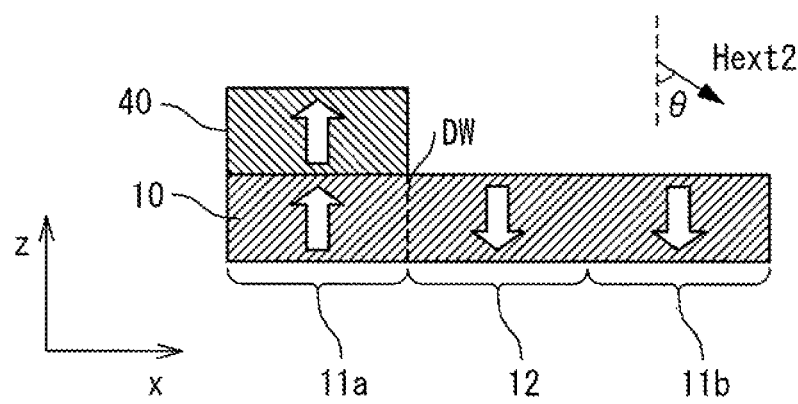
FIG. 10B is the initialization method of the magnetic memory element in one embodiment of the present invention.

The initialization method in this embodiment makes use of the difference between the angle dependency of the nucleation-type threshold magnetic field (according to the Stoner-Wohlfarth theroy) and that of the domain wall motion-type threshold magnetic field (according to the 1/cos θ rule) as shown in FIG. 9. Specifically, all of the magnetization directions are directed in the same direction by an external magnetic field Hext1 as shown in FIG. 10A and an external magnetic field Hext2 having both of perpendicular and in-plane components is then applied as shown in FIG. 10B. In this case, the threshold magnetic field H1 decreases as the angle θ is increased from 0 degree, since the threshold magnetic field H1 necessary for the switching from the A state to the B state in FIG. 8D is based on the nucleation-type magnetization reversal. On the other hand, the threshold magnetic field H2 increases as the angle θ is increased, since the threshold magnetic field H2 necessary for the switching from the B state to the C state is based on the domain wall motion-type magnetization reversal. This allows increasing the initialization margin, that is, the difference between the threshold magnetic field H1 and the threshold magnetic field H2.

Figure 11:
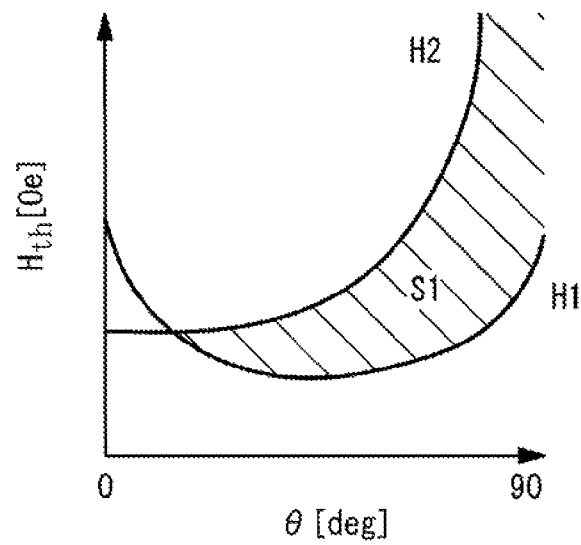
FIG. 11 is a graph showing the initialization margin in one embodiment of the present invention.

FIG. 11 is a graph showing the initialization margin more specifically. It should be noted that FIG. 11 shows an example for a case where no initialization margin exists when the applied angle θ of the external magnetic field Hext2 is zero degree, that is, the external magnetic field Hext2 is exactly directed in the perpendicular direction. Since the threshold magnetic field H1 is smaller than the threshold magnetic field H2 when the applied angle θ is zero degree, no initialization margin exists. Meanwhile, the initialization margin becomes a certain value, since the increase of the angle θ causes a decrease in the threshold magnetic field H1 and an increase in the threshold magnetic field H2. In a region where the applied angle θ is large, a sufficiently large initialization margin can be obtained, since the threshold magnetic field H2 is largely increased.

As thus described, in this embodiment, the domain wall is introduced to perform initialization of the magnetic memory element 70 in a domain wall motion-type magnetic memory formed of perpendicular magnetization films, by using an external magnetic field having both of a magnetic field in the direction perpendicular to the substrate surface (that is, the direction of magnetic anisotropy of the data recording layer 10) and a magnetic field in the direction parallel to the substrate surface (that is, the direction perpendicular to the direction of magnetic anisotropy of the data recording layer 10). It would be apparent to the person skilled in the art that the component of the external magnetic field in the direction parallel to the substrate surface may be any direction in the x-y plane in this initialization.

As is understood from FIG. 9, the threshold magnetic field rapidly increases at the angle of 45 degrees or more, while the angle dependency of the threshold magnetic field in the domain wall motion-type magnetization reversal complies with 1/cos θ. That is, the direction of the magnetic field used for the initialization is desirably directed to an angle of 45 degrees or more with respect to the angle of the magnetic anisotropy of the data recording layer 10. The direction of the perpendicular magnetic anisotropy of the perpendicular magnetic anisotropy material used for the data recording layer 10 generally exhibits a fluctuation of about 5 degrees. Thus, it is desired that the direction of the external magnetic field Hext2 used for the initialization is less than 85 degrees with respect to the angle of the magnetic anisotropy of the data recording layer 10.

Figure 12:
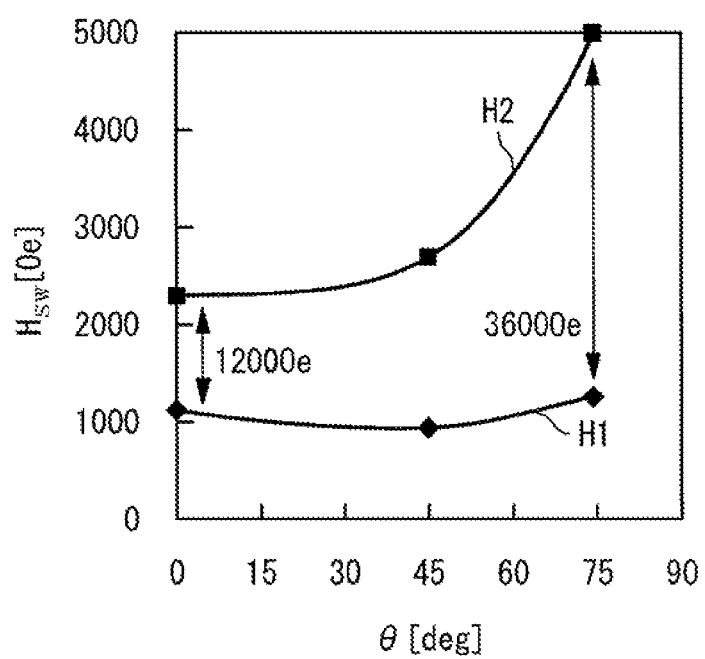
FIG. 12 is a graph showing measured values of the initialization margin.

FIG. 12 shows an experimental result of the initialization of the magnetic memory element 70 according to the initialization method in this embodiment. As defined above, the threshold magnetic fields H1 and H2 represent the magnetic field causing the switching from the A state to the B state and the magnetic field causing the switching from the B state to the C state, respectively. The initialization margin is about 1200 (Oe) when the angle θ is 0 degree, while the initialization margin increases to about 3600 (Oe) when the angle θ is 75 degrees. The experimental results clearly show effectiveness of the present invention. In this experiment, CoCrPt alloy is used as the data recording layer 10 and a Co/Pd film stack is used as the auxiliary ferromagnetic layer 40. It should be noted, however, that it is confirmed by experiments that the same effect can be obtained by other material systems.

It should be noted that similar experiments using combinations of various materials have revealed that the domain wall can be effectively introduced with various configurations when the applied angle of the magnetic field is 60 degrees or more and less than 80 degrees. Therefore, it can be concluded that, as the applied angle of the initialization magnetic field, the angle formed with the direction of the magnetic anisotropy of the data recording layer 10 is preferably 60 degrees or more and less than 80 degrees.

Advantages of the method of introducing the domain wall in this embodiment, that is, the initialization method of the magnetic memory element are as follows:

A first advantage of the initialization method of this embodiment using the external magnetic field having both of the magnetic fields in the direction perpendicular to the substrate surface and in the direction parallel to the substrate surface is an increase of the initialization margin. In a large-capacity magnetic memory, the threshold magnetic fields H1 and H2 defined in FIG. 8D generally vary depending on respective bits. As described above, the external magnetic field for introducing the domain wall must be set between the threshold magnetic field H1 and the threshold magnetic field H2; however, a domain wall may not be successfully introduced when this variation is large, resulting in that an unsuccessfully initialized bit may appear. On the other hand, the initialization method of this embodiment effectively increases the initialization margin and thereby reduces the probability that unsuccessfully initialized bits appear, increasing the yield.

A second advantage of the initialization method of this embodiment is improvement in the characteristics, including writing and reading properties due to an increase in choices of material systems which can be used. That is, when the conventional initialization method is used, material systems used for the data recording layer 10 and the auxiliary ferromagnetic layer 40 are limited to eliminate defective initialization. Additionally, a combination of materials that facilitate introduction of the domain wall generally leads to an excessive increase in the pin potential at a pin site of the domain wall, disadvantageously resulting in an excessive increase in the write current. On the contrary, the use of the initialization method in this embodiment allows preferential improvements in other characteristics such as writing characteristics by making use of increased choices of the combinations of materials for the data recording layer 10 and the auxiliary ferromagnetic layer 40, providing a magnetic memory having excellent properties other than the initialization property.

Similarly, choices of the manufacturing method are also increased. The initialization method in this embodiment, which facilitates the introduction of the domain wall, reduces limitations in positional relationship between the data recording layer and the domain wall introduction mechanism, and so on. This allows adopting a more simple manufacturing method.

The above-mentioned initialization method of the magnetic memory element can be applied to various embodiments of magnetic memory elements. In the following, a description is given of various modifications of the magnetic memory element that can be initialized by the above-mentioned initialization method with reference to the figures.

(First Modification)

Figure 13A:
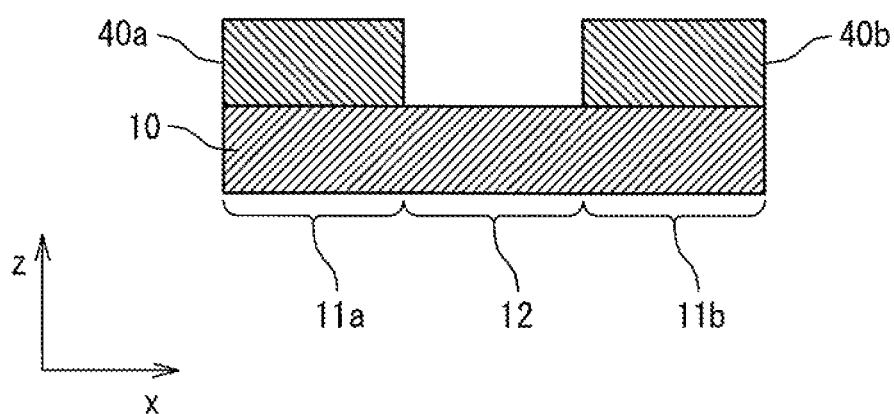
FIG. 13A is a sectional view showing a configuration of a magnetic memory element in a first modification.
Figure 13B:
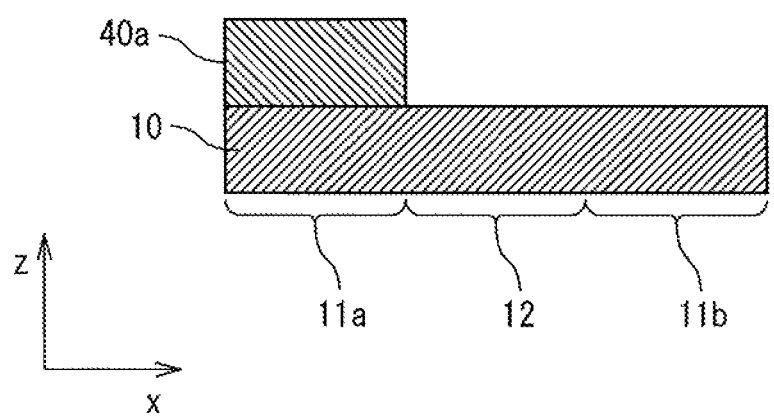
FIG. 13B is a sectional view showing another configuration of the magnetic memory element in the first modification.

FIGS. 13A and 13B schematically show a first modification of the magnetic memory element, specifically, junctions between the data recording layer 10 and the auxiliary ferromagnetic layer 40 (40a, 40b) in the magnetic memory element 70.

The number of the auxiliary ferromagnetic layers 40 provided for the magnetic memory element 70 is optional. That is, two auxiliary ferromagnetic layers 40 may be provided as shown in FIG. 13A or only one auxiliary ferromagnetic layer 40 may be provided as shown in FIG. 13B. Alternatively, three or more auxiliary ferromagnetic layers 40 may be provided. In the example shown in FIG. 13A, a first auxiliary ferromagnetic layer 40a and a second auxiliary ferromagnetic layer 40b are provided adjacent to the first magnetization fixed region 11a and the second magnetization fixed region 11b, respectively.

When a plurality of auxiliary ferromagnetic layers are provided as shown in FIG. 13A, the auxiliary ferromagnetic layers (the first auxiliary ferromagnetic layer 40a and the second auxiliary ferromagnetic layer 40b) may be formed of different materials or film stacks.

In the configuration shown in FIG. 13A, the material and/or configuration of the first auxiliary ferromagnetic layer 40a may be different from that of the second auxiliary ferromagnetic layer 40b. In this case, the first auxiliary ferromagnetic layer 40a and the second auxiliary ferromagnetic layer 40b may be formed so that the magnetization reversal of one of the layers is controlled by domain wall motion and the magnetization reversal of the other layer is controlled by nucleation. Specifically, material that hardly causes domain wall motion and nucleation may be used for the first auxiliary ferromagnetic layer 40a, while material that has a small domain wall motion magnetic field and a small nucleation magnetic field may be used for the second auxiliary ferromagnetic layer 40b. In this case, a magnetization reversal is caused by a small magnetic field in the second auxiliary ferromagnetic layer 40b, the second magnetization fixed region 11b adjacent to the second auxiliary ferromagnetic layer 40b and the magnetization free region 12, while no domain wall motion occurs in the first auxiliary ferromagnetic layer 40a and the first magnetization fixed region 11a due to a large domain wall motion magnetic field, avoiding the magnetization reversal. A domain wall can be easily introduced in this way.

Figure 16:
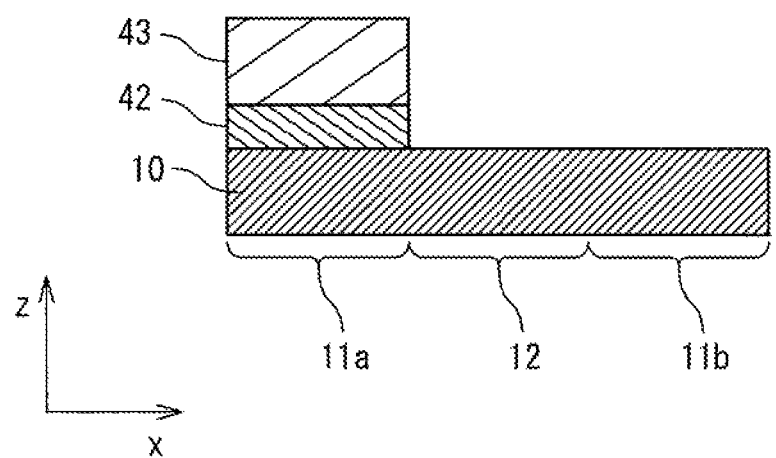
FIG. 16 is a sectional view showing another configuration of the magnetic memory element in the third modification.

Alternatively, the configuration of the domain wall introduction mechanism adjacent to the first magnetization fixed region 11a may be different from that adjacent to the second magnetization fixed region 11b. The structures of the domain wall introduction mechanism adjacent to the respective magnetization fixed regions may be selected from the structures described below in a third modification. For example, when the ferromagnetic layer is directly joined to the first magnetization fixed region 11a and a domain wall introduction mechanism having a synthetic antiferromagnetic coupling shown in FIG. 16 is provided adjacent to the second magnetization fixed region 11b, the effects of the present invention can be obtained more preferably.

(Second Modification)

Figure 14A:
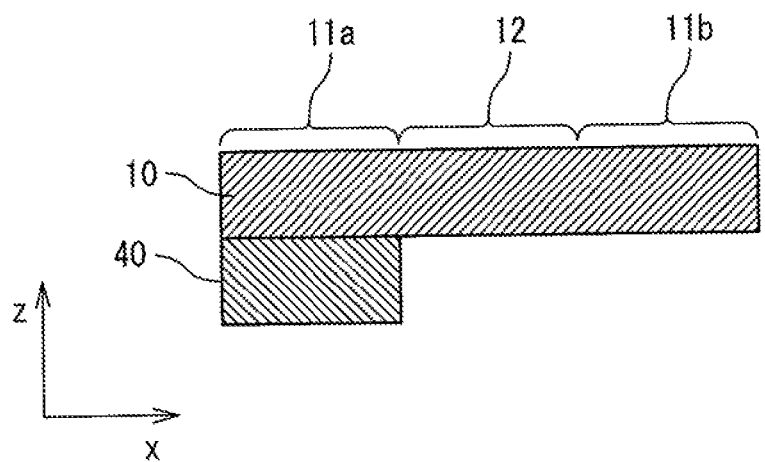
FIG. 14A is a sectional view showing a configuration of a magnetic memory element in a second modification.
Figure 14B:
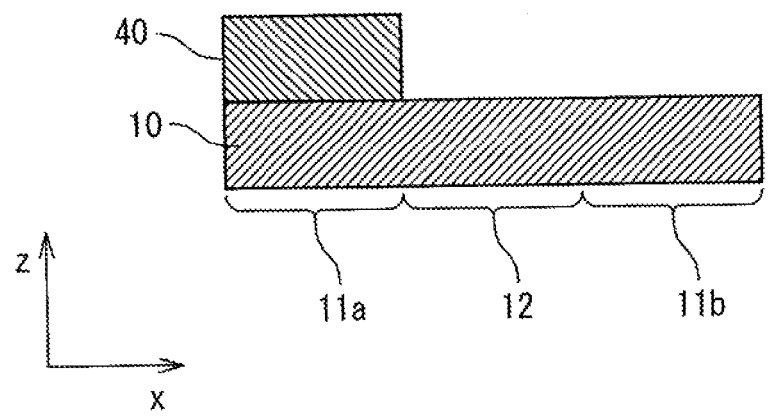
FIG. 14B is a sectional view showing another configuration of the magnetic memory element in the second modification.

FIGS. 14A and 14B schematically show a second modification of the magnetic memory element, more specifically, the junction between the data recording layer 10 and the auxiliary ferromagnetic layer 40 in the magnetic memory element 70. The position of the auxiliary ferromagnetic layer 40 is optional. That is, the auxiliary ferromagnetic layer 40 may be joined to the lower surface of the first magnetization fixed region 11a of the data recording layer 10 as shown in FIG. 14A, or may be joined to the upper surface of the first magnetization fixed region 11a as shown in FIG. 14B. Further, the auxiliary ferromagnetic layer 40 may be joined laterally to the data recording layer 10.

(Third Modification)

FIGS. 15 to 18 show a third modification of the magnetic memory element, specifically, various structures of the domain wall introduction mechanism provided in the magnetic memory element 70. The domain wall introduction mechanism for introducing the domain wall into the data recording layer 10, which is provided in the magnetic memory element 70, may be variously structured. In detail, although an example in which the auxiliary ferromagnetic layer 40 made of ferromagnetic material is provided as the domain wall introduction mechanism has been described above, a domain wall introduction mechanism with a different structure may be adopted.

Figure 15:
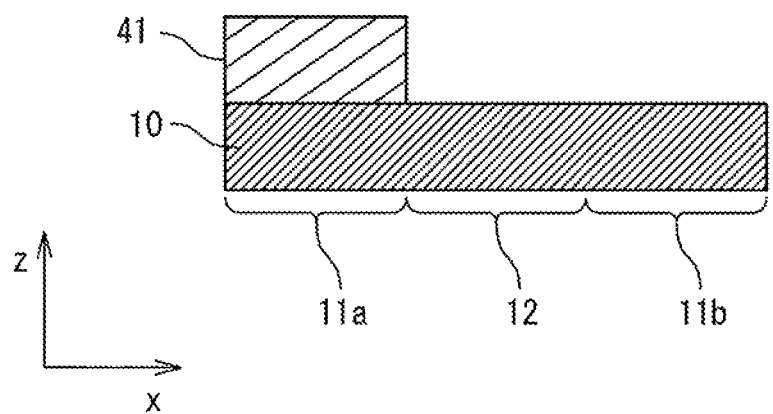
FIG. 15 is a sectional view showing a configuration of a magnetic memory element in a third modification.

FIG. 15 shows an example of the domain wall introduction mechanism. In FIG. 15, an antiferromagnetic layer 41 made of antiferromagnetic material is provided as the domain wall introduction mechanism. Examples of antiferromagnetic materials that can be used for the antiferromagnetic layer 41 include Pt—Mn and Ir—Mn. The antiferromagnetic layer 41 is joined to the first magnetization fixed region 11a. Although the antiferromagnetic layer 41 is joined to the upper surface of the first magnetization fixed region 11a in FIG. 15, the antiferromagnetic layer 41 may be joined to the lower surface of the first magnetization fixed region 11a.

When the antiferromagnetic layer 41 is provided adjacent to the first magnetization fixed region 11a, exchange bias coupling is achieved between the antiferromagnetic layer 41 and the first magnetization fixed region 11a, thereby increasing the domain wall motion magnetic field in the first magnetization fixed region 11a. Therefore, the antiferromagnetic layer 41 has an effect of increasing the initialization margin. It should be noted, however, that the initialization margin becomes zero in a case where the external magnetic field used at initialization is directed in the perpendicular direction, even if the antiferromagnetic layer 41 is made adjacent; the initialization margin has a finite value only when the magnetic field has the component in the direction parallel to the substrate surface. That is, the use of the antiferromagnetic layer 41 as the domain wall introduction mechanism allows the initialization method of the magnetic memory element in this embodiment to work very effectively, causing more preferable effects. Since the antiferromagnetic layer 41 does not generate a leakage magnetic field outside, the antiferromagnetic layer 41 preferably avoids increasing in the pin potential at the pin site of the domain wall. The use of the antiferromagnetic layer 41 is also advantageous to reduce the write current.

FIG. 16 shows another example of the domain wall introduction mechanism. In FIG. 16, a film stack that exhibits synthetic antiferromagnetic coupling is provided as the domain wall introduction mechanism. Specifically, in this example, a coupling layer 42 is joined to the first magnetization fixed region 11a of the data recording layer 10 and a second auxiliary ferromagnetic layer 43 is joined to the coupling layer 42. The coupling layer 42 is formed of nonmagnetic material, and one example of materials that can be used for the coupling layer 42 is Ru. Materials that can be used for the second auxiliary ferromagnetic layer 43 are same as those that can be used for the auxiliary ferromagnetic layer 40.

The coupling layer 42 is formed of certain material with a film thickness so as to provide antiferromagnetic coupling between the magnetizations of the first magnetization fixed region 11a and the second auxiliary ferromagnetic layer 43. The antiferromagnetic coupling that acts between the first magnetization fixed region 11a and the second auxiliary ferromagnetic layer 43 causes a difference between the first magnetization fixed region 11a and the second magnetization fixed region 11b in the effective coercive force, thereby enabling initialization by the external magnetic field.

Also with the configuration of the domain wall introduction mechanism in FIG. 16, the initialization margin is increased in the initialization by the external magnetic field having both of components in the direction perpendicular to the substrate surface and in the direction parallel to the substrate surface. The inventors have confirmed, through experiments, that a larger initialization margin can be obtained by using a film stack exhibiting synthetic antiferromagnetic coupling as the domain wall introduction mechanism. That is, also in a case where a film stack exhibiting synthetic antiferromagnetic coupling is used as the domain wall introduction mechanism, more preferable effects can be obtained by the initialization method of the magnetic memory element in this embodiment.

Although FIG. 16 shows the example in which the coupling layer 42 and the second auxiliary ferromagnetic layer 43 are laminated in this order in contact with the first magnetization fixed region 11a as the film stack exhibiting synthetic antiferromagnetic coupling, a film stack exhibiting synthetic antiferromagnetic coupling with a different structure may be used as the domain wall introduction mechanism.

Figure 17:
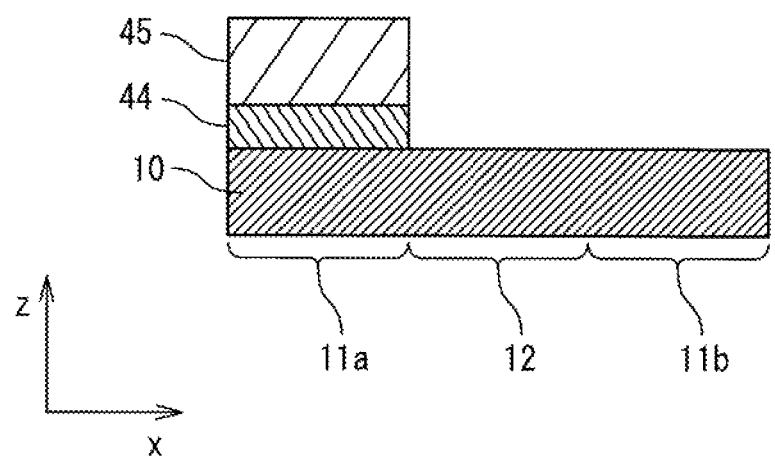
FIG. 17 is a sectional view showing still another configuration of the magnetic memory element in the third modification.

FIG. 17 shows still another example of the domain wall introduction mechanism. In FIG. 17, a third auxiliary ferromagnetic layer 45 and a second nonmagnetic layer 44 are provided as the domain wall introduction mechanism. In the example in FIG. 17, the second nonmagnetic layer 44 is provided adjacent to the first magnetization fixed region 11a and the third auxiliary ferromagnetic layer 45 is provided adjacent to the second nonmagnetic layer 44. The second nonmagnetic layer 44 is made of nonmagnetic material and the third auxiliary ferromagnetic layer 45 is made of ferromagnetic material. Even when the third auxiliary ferromagnetic layer 45 is not provided adjacent to the first magnetization fixed region 11a unlike the case in FIG. 17, the third auxiliary ferromagnetic layer 45 causes an effect on the first magnetization fixed region 11a through the leakage magnetic field, thereby increasing the coercive force of the first magnetization fixed region 11a. The second nonmagnetic layer 44 may function to magnetically couple the third auxiliary ferromagnetic layer 45 to the first magnetization fixed region 11a.

The second nonmagnetic layer 44 may also function as an underlayer or a cap layer of the data recording layer 10. Accordingly, the magnetic memory element can be manufactured more easily in this embodiment. That is, when the domain wall introduction mechanism includes the second nonmagnetic layer 44 and the second nonmagnetic layer 44 is provided adjacent to at least one of the first magnetization fixed region 11a and the second magnetization fixed region 11b, more preferable effects of the initialization method of the magnetic memory according to the present invention can be obtained.

Various materials may be used for the second nonmagnetic layer 44. The materials may be conductive or nonconductive. Specifically, examples of materials that can be used for the second nonmagnetic layer 44 include Ta, W, Ru, Al—O and Mg—O, for example.

Figure 18:
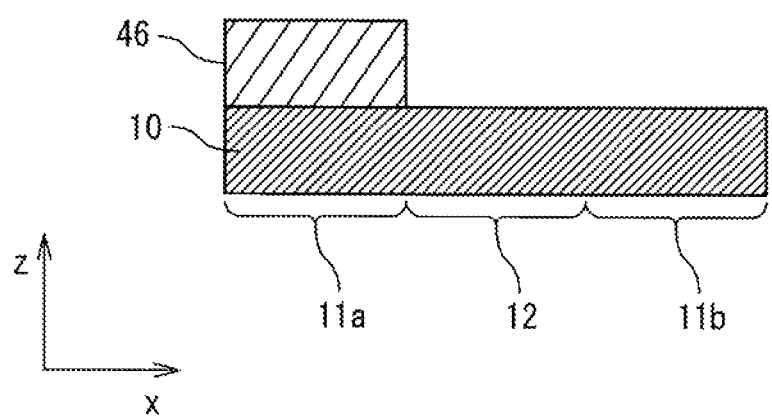
FIG. 18 is a sectional view showing still another configuration of the magnetic memory element in the third modification.

FIG. 18 shows still another example of the magnetic memory element 70. In FIG. 18, a third nonmagnetic layer 46 is provided as the domain wall introduction mechanism. In the example in FIG. 18, the third nonmagnetic layer 46 is provided adjacent to only the first magnetization fixed region 11a. The third nonmagnetic layer 46 is made of nonmagnetic material.

In one embodiment, the third nonmagnetic layer 46 is formed by forming a nonmagnetic film to be the third nonmagnetic layer 46 on the data recording layer 10 and then etching a part of the nonmagnetic film. In this case, the second magnetization fixed region 11b and the magnetization free region 12 are exposed to etching gas and air by etching, and thus have magnetic properties that are different from those of the first magnetization fixed region 11a. Generally, exposure to the etching gas and air decreases the nucleation magnetic field of the second magnetization fixed region 11b and the magnetization free region 12. This causes a difference in the coercive force between the first magnetization fixed region 11a and the second magnetization fixed region 11b, enabling the initialization of the memory state by the external magnetic field.

The inventors has confirmed that, through experiments, the configurations shown in FIGS. 15 to 18 allows introducing a domain wall by using an external magnetic field having both of components in the direction perpendicular to the substrate surface and in the direction parallel to the substrate surface in this embodiment, even in a case where a domain wall cannot be introduced with a magnetic field of an angle θ of zero degree, that is, with a perpendicular magnetic field. In other words, more preferable effects of the initialization method of the magnetic memory element in this embodiment can be obtained also when the third nonmagnetic layer 46 is used as the domain wall introduction mechanism.

(Fourth Modification)

Figure 19A:
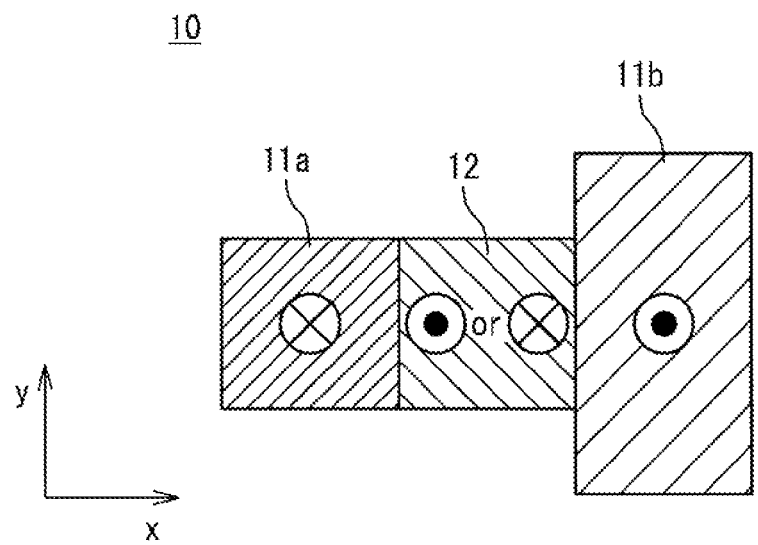
FIG. 19A is a plan view showing a configuration of a magnetic memory element in a fourth modification.
Figure 19B:
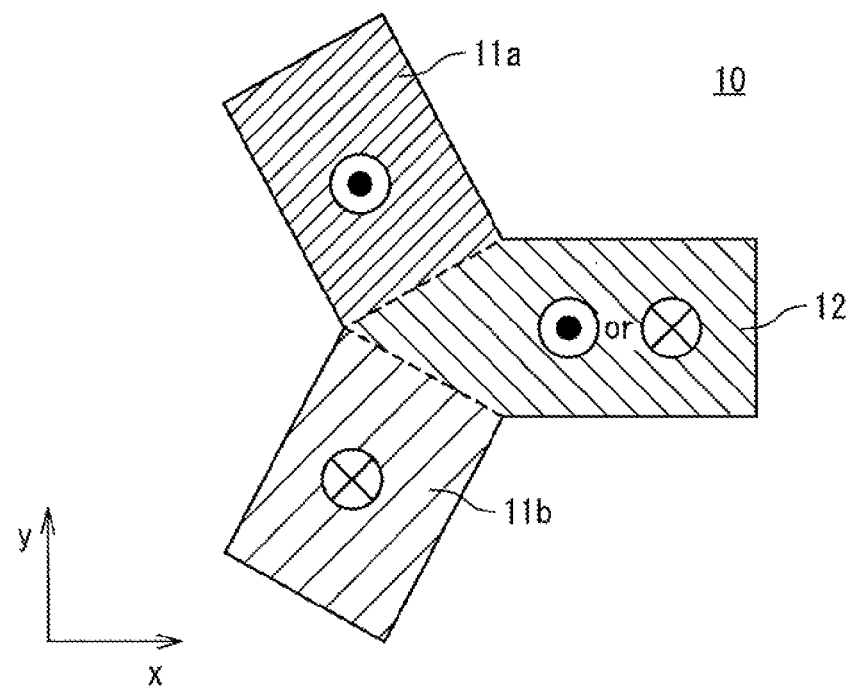
FIG. 19B is a plan view showing another configuration of the magnetic memory element in the fourth modification.

FIG. 19A and FIG. 19B schematically show a fourth modification of the magnetic memory element, specifically, configurations of the data recording layer 10.

The above description is given with an assumption that the data recording layer 10 for recording data is rectangular in the x-y plane (in a plane parallel to the substrate surface), the first magnetization fixed region 11a is connected to one end of the magnetization free region 12 and the second magnetization fixed region 11b is connected to the other end of the magnetization free region 12. Actually, the shape of the data recording layer 10 may be variously changed, and the arrangement of the first magnetization fixed region 11a, the second magnetization fixed region 11b and the magnetization free region 12 may be variously changed.

FIG. 19A shows an example of the configuration of the data recording layer 10. The first magnetization fixed region 11a and/or the second magnetization fixed region 11b of the data recording layer 10 may be formed to be larger than the magnetization free region 12 in the width. FIG. 19A shows an example in which the second magnetization fixed region 11b is formed to be larger than other regions in width.

As shown in FIG. 19A, the write operation is further stabilized by forming the first magnetization fixed region 11a and/or the second magnetization fixed region 11b to be larger than the magnetization free region 12 in the width. In other words, in the write operation for writing data "0" as described above with reference to FIG. 3B, the domain wall moves from the boundary between the first magnetization fixed region 11a and the magnetization free region 12 to the boundary between the second magnetization fixed region 11b and the magnetization free region 12 and then stops. It is preferable that the domain wall correctly stops at the boundary between the second magnetization fixed region 11b and the magnetization free region 12, and the domain wall stops at the boundary more reliably when the width of the second magnetization fixed region 11b is formed to be large as shown in FIG. 19A, since the current density is sufficiently decreased there.

Meanwhile, FIG. 19B shows another example of the data recording layer 10. The data recording layer 10 may be Y-shaped as shown in FIG. 19B. In FIG. 19B, the data recording layer 10 is formed of a magnetization free region 12 extended in the x direction, a first magnetization fixed region 11a connected to one end (–x side) of the magnetization free region 12 and a second magnetization fixed region 11b connected to the one end of the magnetization free region 12. That is, the data recording layer 10 forms a three-forked path. Also in this case, the magnetization of the first magnetization fixed region 11a and the magnetization of the second magnetization fixed region 11b are perpendicular direction at least a part thereof and fixed in the direction antiparallel to each other. The magnetization of the magnetization free region 12 is directed in the perpendicular direction and allowed to be directed upwards or downwards.

Figure 20A:
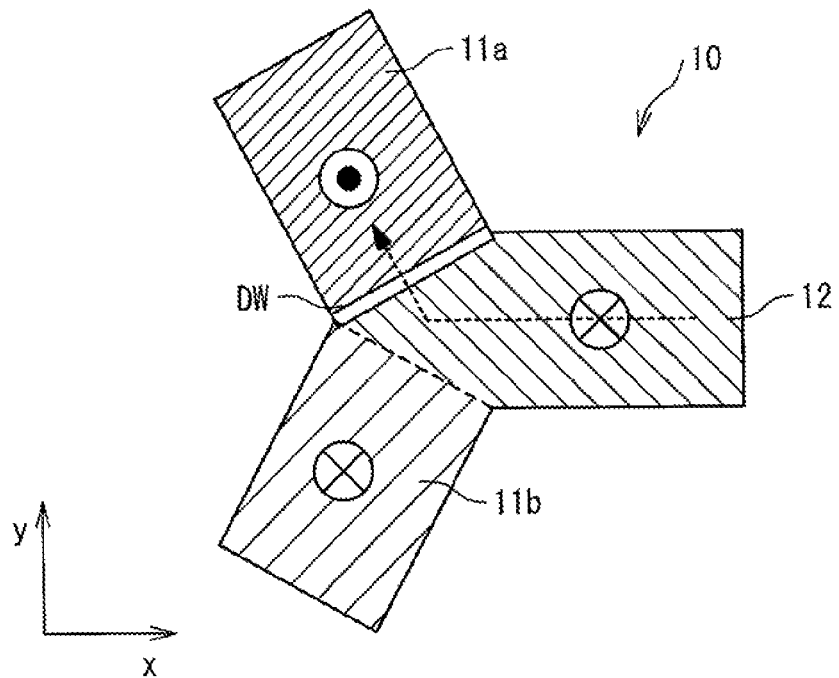
FIG. 20A is a plan view showing a write operation into the magnetic memory element shown in FIG. 19B.
Figure 20B:
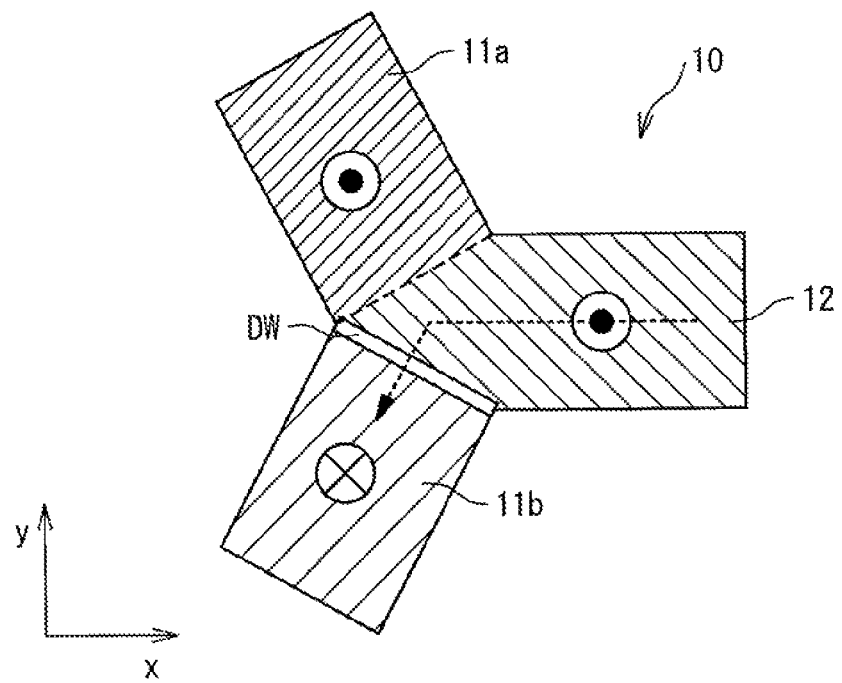
FIG. 20B is a plan view showing the write operation into the magnetic memory element shown in FIG. 19B.

A description is given of a writing method in a case where the data recording layer 10 is Y-shaped as shown in FIG. 19B with reference to FIGS. 20A and 20B. FIG. 20A schematically shows an operation for writing data "1" when the magnetic memory element 70 is placed in the "0" state and FIG. 20B schematically shows an operation for writing data "0" when the magnetic memory element 70 is in the "1" state. It is assumed that the first magnetization fixed region 11a and the second magnetization fixed region 11b have magnetizations fixed in the upward direction and magnetization fixed in the downward direction, respectively. The state where the magnetization free region 12 is magnetized downwards is defined as the "0" state and the state where the magnetization free region 12 is magnetized upwards is defined as the "1" state. In this case, the domain wall (DW) is formed at the boundary between the first magnetization fixed region 11a and the magnetization free region 12 in the "0" state as shown in FIG. 20A. Here, when a current is flown in the direction indicated by the dotted line shown in FIG. 20A, the domain wall (DW) moves to the side opposite to the end of the magnetization free region 12 to which the first magnetization fixed region 11a is connected due to the current-induced domain wall motion, and switching to the "1" state occurs as shown in FIG. 20B. Similarly, in the "1" state as shown in FIG. 20B, the domain wall (DW) is formed at the boundary between the second magnetization fixed region 11b and the magnetization free region 12. Here, when a current is flown in the direction indicated the dotted line shown in FIG. 20B, the domain wall (DW) moves to the side opposite to the end of the magnetization free region 12 to which the second magnetization fixed region 11b is connected due to the current-induced domain wall motion, and switching to the "0" state occurs as shown in FIG. 20A. In this manner, data can be rewritten.

With the configuration in which the data recording layer 10 is shaped like the three-forked path as shown in FIG. 19B, writing is achieved by leading the domain wall to the end of the magnetization free region 12. Such writing operation is preferable in achieving a more stable writing operation.

(Fifth Modification)

Figure 21A:
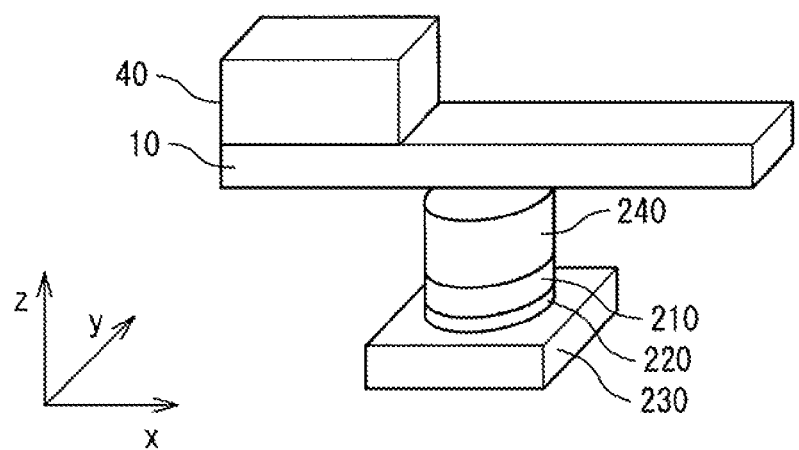
FIG. 21A is a perspective view showing a configuration of a magnetic memory element in a fifth modification.
Figure 21B:
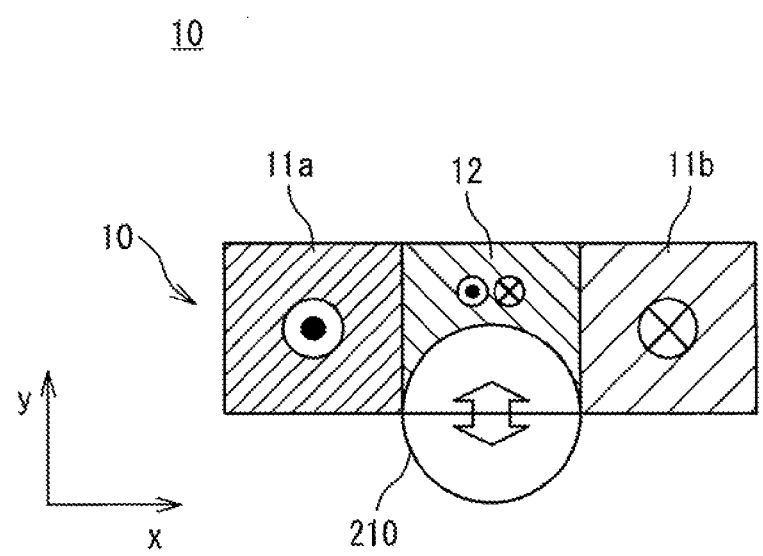
FIG. 21B is a plan view showing the configuration of the magnetic memory element in the fifth modification.
Figure 21C:
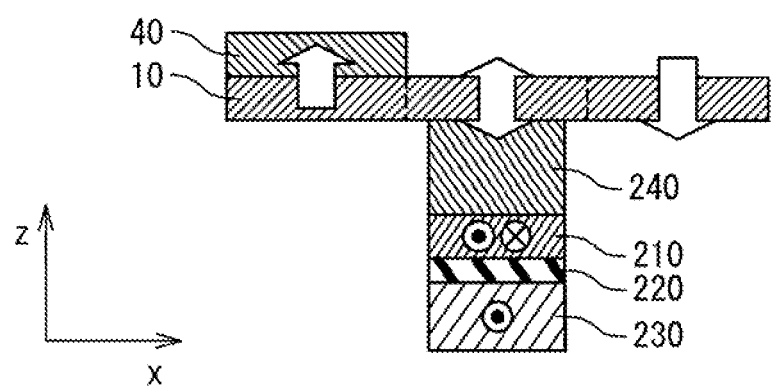
FIG. 21C is a sectional view showing the configuration of the magnetic memory element in the fifth modification.

FIGS. 21A to 21C are diagrams schematically showing a fifth modification of the magnetic memory element. FIG. 21A is a perspective view of the fifth modification, FIG. 21B is a plan view of the fifth modification and FIG. 21C is a sectional view of the fifth modification.

In the above-mentioned magnetic memory element, as a reading mechanism for reading data from the data recording layer 10, the first nonmagnetic layer 20 is provided adjacent to the magnetization free region 12 of the data recording layer 10 and the first magnetization fixed layer 30 is provided adjacent to the first nonmagnetic layer 20. In the fifth modification, another structure of the reading mechanism is proposed.

In the fifth modification, a magnetization free layer 210, a third nonmagnetic layer 220 and a second magnetization fixed layer 230 are provided as the reading mechanism. In addition, it is preferable that a contact layer 240 is provided between the data recording layer 10 and the magnetization free layer 210. The magnetization free layer 210, the third nonmagnetic layer 220 and the second magnetization fixed layer 230 are laminated in this order to form a magnetic tunnel junction (MTJ).

Preferably, the center of gravity of the magnetization free layer 210 is shifted from the center of gravity of the magnetization free region 12 of the data recording layer 10 in the x-y plane. Hereinafter, the direction of this shift is defined as "the center of gravity shift direction".

The magnetization free layer 210 and the second magnetization fixed layer 230 are each made of ferromagnetic material having magnetic anisotropy in the in-plane direction. For example, Co—Fe—B may be used as the material of the magnetization free layer 210 and the second magnetization fixed layer 230. The direction of the magnetic anisotropy of the magnetization free layer 210 is optional in the in-plane direction. On the contrary, the magnetization of the second magnetization fixed layer 230 is substantially fixed in one direction. It is desired that the direction of the magnetization of the second magnetization fixed layer 230 is parallel to the center of gravity shift direction. The third nonmagnetic layer 220 is made of nonmagnetic dielectric material. For example, Mg—O may be used as the material for the third nonmagnetic layer 220.

Figure 22A:
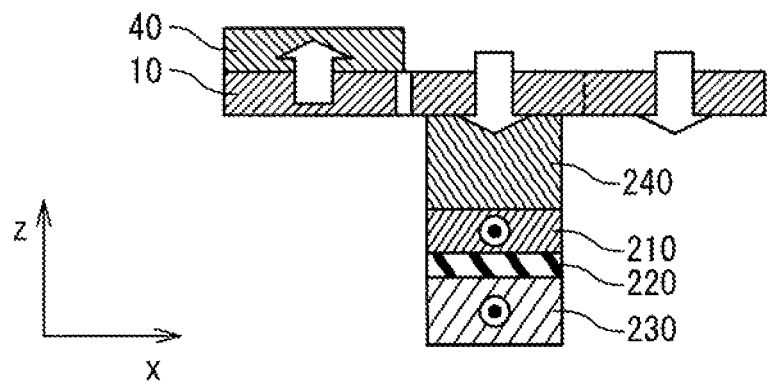
FIG. 22A is a sectional view for depicting data reading from the magnetic memory element in the fifth modification.

In the fifth modification, data stored as the vertical direction of magnetization of the magnetization free region 12 is read by the MTJ having the in-plane magnetizations, which is formed of the magnetization free layer 210, the third nonmagnetic layer 220 and the second magnetization fixed layer 230. The principle will be described with reference to FIGS. 22A and 22B. FIG. 22A shows the magnetization state of the respective layers in the "0" state by arrows and FIG. 22B shows the magnetization state in the "1" state by arrows.

Although the directions of the magnetizations of the first magnetization fixed region 11a, the second magnetization fixed region 11b and the second magnetization fixed layer 230 are fixed in the positive direction of the z axis, the negative direction of the z axis and the negative direction along the y axis, respectively, it would be apparent to those skilled in the art that the directions of the magnetizations of the first magnetization fixed region 11a, the second magnetization fixed region 11b and the second magnetization fixed layer 230 are not limited to these.

As shown in FIG. 22A, in a state where the magnetization of the magnetization free region 12 is directed downwards (that is, the "0" state), the magnetization of the magnetization free layer 210 is directed in the negative direction of the y axis due to the flux leakage caused by the downward magnetization of the magnetization free region 12. This results from that the magnetization free layer 210 is located below the magnetization free region 12 (in the negative direction of the z axis) and the center of gravity of the magnetization free layer 210 is shifted with respect to the magnetization free region 12 in the negative direction of the y axis. As a result, the directions of the magnetizations of the magnetization free layer 210 and the second magnetization fixed layer 230 are directed in parallel to each other, and the MTJ formed of the magnetization free layer 210, the third nonmagnetic layer 220 and the second magnetization fixed layer 230 is placed into the low resistance state.

Figure 22B:
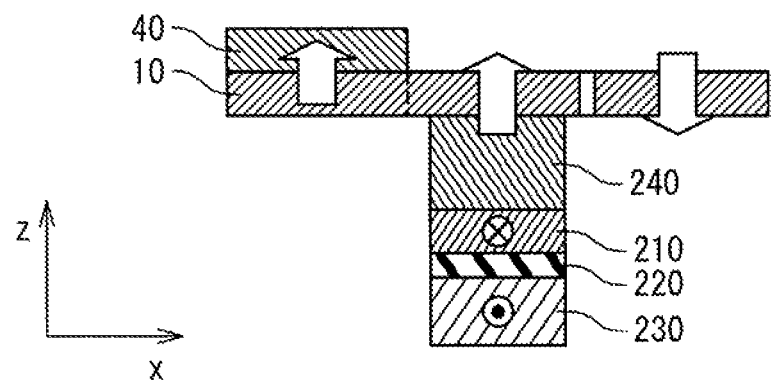
FIG. 22B is a sectional view for depicting data reading from the magnetic memory element in the fifth modification.

In a state where the magnetization of the magnetization free region 12 is directed upwards (that is, the "1" state) as shown in FIG. 22B, on the other hand, the magnetization of the magnetization free layer 210 is directed in the positive direction of the y axis due to the flux leakage caused by the upward magnetization of the magnetization free region 12. As a result, the directions of the magnetizations of the magnetization free layer 210 and the second magnetization fixed layer 230 are directed in antiparallel to each other, and the MTJ is placed into the high resistance state. In this manner, the data stored as the vertical direction of magnetization of the magnetization free region 12 is transmitted to the magnetization of the magnetization free layer 210 having the in-plane magnetization and can be read by the MTJ having the in-plane magnetization.

The MTJ formed with in-plane magnetizations can generally obtain a high magnetoresistance effect ratio (MR ratio). Therefore, the magnetic memory element in the fifth modification can obtain a large read signal.

Although the magnetization free layer 210, the third nonmagnetic layer 220 and the second magnetization fixed layer 230 are shown as being arranged below the data recording layer 10 (in the negative direction along the z axis) in FIGS. 21A and 21B, the arrangement is optional. For example, the magnetization free layer 210, the third nonmagnetic layer 220 and the second magnetization fixed layer 230 may be located above the data recording layer 10. Further, although the center of gravity shift direction, which is the shift direction of the center of gravity of the magnetization free layer 210 from the center of gravity of the magnetization free region 12, is shown as the negative direction of the y axis in these figures, the center of gravity shift direction is optional and may be the positive direction of y axis or have an x component.

Although specific embodiment and modifications according to the present invention are described above, it would be apparent to those skilled in the art that the present invention can be variously modified and implemented. It should be noted that the above-mentioned embodiment and modifications may be implemented in any combination so as not to cause any contradiction.

The invention claimed is:

1. An initialization method of a magnetic memory element including a data recording layer having perpendicular magnetic anisotropy and comprising: a first magnetization fixed region; a second magnetization fixed region; and a magnetization free region connected to said first and second magnetization fixed regions, wherein said data recording layer is structured so that said first and second magnetization fixed regions have different coercive fields, said method comprising:

a step of directing magnetizations of said first magnetization fixed region, said second magnetization fixed region and said magnetization free region in a same first direction; and a step of applying to said data recording layer a magnetic field having both of components perpendicular to and parallel to the direction of the magnetic anisotropy of said data recording layer, to thereby direct the magnetizations of said magnetization free region and said second magnetization fixed region in a second direction opposite to said first direction.

2. The initialization method according to claim 1, wherein an angle between a direction in which said magnetic field is applied and the direction of the magnetic anisotropy of said data recording layer is equal to or more than 45 degrees and less than 85 degrees.

3. The initialization method according to claim 2, wherein the angle between the direction in which said magnetic field is applied and the direction of the magnetic anisotropy of said data recording layer is equal to or more than 60 degrees and less than 80degrees.

4. The initialization method according to claim 1, wherein said magnetic memory element includes a first domain wall introduction mechanism connected to said first magnetization fixed region.

5. The initialization method according to claim 4, wherein said first domain wall introduction mechanism includes an auxiliary ferromagnetic layer connected to said first magnetization fixed region.

6. The initialization method according to claim 4, wherein said first domain wall introduction mechanism includes an antiferromagnetic layer connected to said first magnetization fixed region.

7. The initialization method according to claim 4, wherein said first domain wall introduction mechanism includes a nonmagnetic layer connected to said first magnetization fixed region.

8. The initialization method according to claim 2, wherein said magnetic memory element includes a first domain wall introduction mechanism coupled to said first magnetization fixed region.

9. The initialization method according to claim 3, wherein said magnetic memory element includes a first domain wall introduction mechanism coupled to said first magnetization fixed region.

10. An initialization method of a magnetic memory element including a data recording layer having perpendicular magnetic anisotropy and comprising: a first magnetization fixed region; a second magetization fixed region; and a magnetization free region connected to said first and second magnetization fixed regions, wherein said data recording layer is structured so that said first and second magnetization fixed regions have different coercive fields, said method comprising:
- a step of directing magnetizations of said first magnetization fixed region, said second magnetization fixed region and said magnetization free region in a same direction; and
- a step of applying to said data recording layer a magnetic field having both of components perpendicular to and parallel to the direction of the magnetic anisotropy of said data recording layer,
- wherein said magnetic memory element includes a first domain wall introduction mechanism connected to said first magnetization fixed region,
- wherein said first domain wall introduction mechanism includes a film stack of a nonmagnetic layer and an auxiliary ferromagnetic layer, the film stack being connected to said first magnetization fixed region, and
- wherein said nonmagnetic layer provides an antiferromagnetic coupling between said auxiliary ferromagnetic layer and said first magnetization fixed region.

11. An initialization method of a magnetic memory element including a data recording layer having perpendicular magnetic anisotropy and comprising: a first magnetization fixed region; a second magnetization fixed region; and a magnetization free region connected to said first and second magnetization fixed regions, wherein said data recording layer is structured so that said first and second magnetization fixed regions have different coercive fields, said method comprising:
- a step of directing magnetizations of said first magnetization fixed region, said second magnetization fixed region and said magnetization free region in a same direction; and
- a step of applying to said data recording layer a magnetic field having both of components perpendicular to and parallel to the direction of the magnetic anisotropy of said data recording layer,
- wherein said magnetic memory element includes a first domain wall introduction mechanism connected to said first magnetization fixed region,
- wherein said magnetic memory element further includes a second domain wall introduction mechanism connected to said second magnetization fixed region, and
- wherein said first and second domain wall introduction mechanisms have different structures.

12. The initialization method according to claim 11, wherein said first domain wall introduction mechanism includes an auxiliary ferromagnetic layer connected to said first magnetization fixed region.

13. The initialization method according to claim 11, wherein said first domain wall introduction mechanism includes an antiferromagnetic layer connected to said first magnetization fixed region.

14. The initialization method according to claim 11, wherein said first domain wall introduction mechanism includes a nonmagnetic layer connected to said first magnetization fixed region.

15. The initialization method according to claim 11 wherein said first domain wall introduction mechanism includes a film stack of a nonmagnetic layer and an auxiliary ferromagnetic layer, the film stack being coupled to said first magnetization fixed region, and
- wherein said nonmagnetic layer provides an antiferrogmagnetic connection between said auxiliary ferromagnetic layer and said first magnetization fixed region.

* * * * *